(12) United States Patent
Tsuchiya et al.

(10) Patent No.: US 8,169,040 B2
(45) Date of Patent: May 1, 2012

(54) SEMICONDUCTOR DEVICE AND METHOD FOR MANUFACTURING THE SAME

(75) Inventors: Yoshinori Tsuchiya, Yokohama (JP); Masato Koyama, Miura-Gun (JP); Masahiko Yoshiki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 122 days.

(21) Appl. No.: 12/824,266

(22) Filed: Jun. 28, 2010

(65) Prior Publication Data

US 2010/0258880 A1    Oct. 14, 2010

Related U.S. Application Data

(63) Continuation of application No. 12/631,891, filed on Dec. 7, 2009, now Pat. No. 7,768,077, which is a continuation of application No. 11/687,834, filed on Mar. 19, 2007, now Pat. No. 7,737,503.

(30) Foreign Application Priority Data

Jun. 8, 2006  (JP) ............................... 2006-159802
Dec. 7, 2006  (JP) ............................... 2006-330481

(51) Int. Cl.
  *H01L 21/70* (2006.01)

(52) U.S. Cl. ........ 257/407; 257/410; 257/765; 257/771; 257/E29.15; 257/E29.16

(58) Field of Classification Search .................. 257/407, 257/410, 412, 413, 765, 771, E29.15, E29.16, 257/E29.161
See application file for complete search history.

(56) References Cited

U.S. PATENT DOCUMENTS

| 5,670,279 | A  | 9/1997  | Goldstein      |
| 6,833,596 | B2 | 12/2004 | Matsuo         |
| 7,528,024 | B2 | 5/2009  | Colombo et al. |
| 2005/0037580 | A1 | 2/2005 | Nakajima et al. |
| 2007/0018259 | A1 | 1/2007 | Ko et al. |
| 2008/0224236 | A1 | 9/2008 | Ren et al. |

FOREIGN PATENT DOCUMENTS

JP    2002-299610    10/2002

(Continued)

OTHER PUBLICATIONS

Y.H. Kim et al., "Systematic Study of Workfunction Engineering and Scavenging Effect Using NiSi Alloy FUSI Metal Gates with Advanced Gate Stacks," International Electron Devices Meeting Technical Digest (IEDM), IEEE, pp. 665-668, 2005.

(Continued)

*Primary Examiner* — Evan Pert
*Assistant Examiner* — Eduardo A Rodela
(74) *Attorney, Agent, or Firm* — Oblon, Spivak, McClelland, Maier & Neustadt, L.L.P.

(57) ABSTRACT

A semiconductor device includes: an n-channel MIS transistor and a p-channel MIS transistor. An n-channel MIS transistor includes: a first gate insulating film having an amorphous layer or an epitaxial layer formed on a p-type semiconductor region between a first source/drain regions; and a first gate electrode having a stack structure formed with a first metal layer and a first compound layer. The first metal layer is formed on the first gate insulating film and made of a first metal having a work function of 4.3 eV or smaller, and the first compound layer is formed on the first metal layer and contains a compound of a second metal and a IV-group semiconductor. The second metal is different from the first metal. A p-channel MIS transistor includes a second gate electrode having a second compound layer containing a compound of the same composition as the first compound layer.

28 Claims, 21 Drawing Sheets

FOREIGN PATENT DOCUMENTS

| | | |
|---|---|---|
| JP | 2003-282875 | 10/2003 |
| JP | 2004-214366 | 7/2004 |
| JP | 2005-64449 | 3/2005 |
| JP | 2006-80409 | 3/2006 |
| JP | 2006-93670 | 4/2006 |

OTHER PUBLICATIONS

Nivedita Biswas et al., "$Ni_xTa_{1-x}Si$ and $Ni_xPt_{1-x}Si$ Ternary Alloys for Work Function Tuning on $SiO_2$, $HfSiO_x$ and $HfO_2$ Dielectrics," International Electron Devices Meeting Technical Digest (IEDM), IEEE, pp. 657-660, 2005.

SEMICONDUCTOR DEVICE AND METHOD FOR MANUFACTURING THE SAME

CROSS-REFERENCE TO RELATED APPLICATION

This application is a continuation of and claims the benefit of priority under 35 U.S.C. §120 from U.S. application Ser. No. 12/631,891, filed Dec. 7, 2009, which is a continuation of U.S. application Ser. No. 11/687,834, filed Mar. 19, 2007, which is based upon and claims the benefit of priority under 35 U.S.C. §119 from Japanese Patent Application Nos. 2006-159802 and 2006-330481 respectively filed on Jun. 8 and Dec. 7, 2006 in Japan, the entire contents of both of which are incorporated herein by reference.

BACKGROUND OF THE INVENTION

1. Field of the Invention

The present invention relates to a semiconductor device having MISFETs and a method for manufacturing the semiconductor device.

2. Related Art

"Silicon large-scale integrated circuit" is one of the fundamental device technologies that will support the advanced information society in the future. To produce an integrated circuit with highly sophisticated functions, it is necessary to prepare semiconductor devices that yield high performances, such as MOSFETs (Metal-Oxide-Semiconductor Field Effect Transistors) or CMOSFETs (Complementary MOSFETs) that can constitute an integrated circuit. The performances of devices have been improved basically in accordance with the scaling rule. In recent years, however, it has been difficult to achieve high performances by making devices smaller, due to various physical limitations.

With gate electrodes formed with silicon, there have been such problems as the increasing gate parasitic resistance observed with the higher device operation speed, the decreases of the effective capacitances of insulating films due to the carrier depletion at the interfaces with the insulating films, and the variations in threshold voltage due to the added impurities spreading into the channel regions. To solve those problems, metal gate materials have been suggested.

One of the metal gate electrode forming techniques is a fully-silicided gate electrode technique by which all the gate electrodes are silicided with Ni or Co. To achieve a device operation with an optimum operational threshold voltage, the metal gate electrodes need to have different work functions according to the conductivity types.

This is because the operational threshold voltage of each MIS transistor is modulated with the variation of the gate electrode work function (the effective work function (Φeff)) at the interface between the gate electrode and the gate insulating film. The formation of the gate electrodes having the respective optimum work functions according to the conductivity types complicates the production process of the CMOSFET, and increases the production costs. Therefore, methods for controlling the work function of each electrode through simple procedures are being developed.

For example, when a fully-silicided gate electrode is formed with NiSi, the work function is controlled by depositing another metal at the same time as the Ni deposition (see Y. H. Kim et al., Tech. Dig. IEDM2005, p. 665 (hereinafter referred to as Document 1), and N. Biswas et al., Tech. Dig. IEDM2005, p. 657 (hereinafter referred to as Document 2)).

In the structure disclosed in Document 1, a Ni film and an Al film are formed at the same time, so as to form a fully-silicided gate electrode. By doing so, an Al segregation layer is formed, and a work function of 4.3 eV, which is suitable for an n-type MOS metal on a gate insulating film made of $HfO_2$, is achieved. In the structure disclosed in Document 2, a Ni film and a Ta or Pt film are formed at the same time, so that work functions of 4.2 eV and 4.9 eV, which are suitable for an n-type MOS metal and a p-type MOS metal on a gate insulating film made of $SiO_2$, are achieved. By those simultaneous film forming methods, however, different metal elements are added in accordance with the conductivity types. Therefore, it is necessary to carry out an independent process for forming a full-silicide for each of the conductivity types. This further complicates the production process. In the structure disclosed in Document 1, Al enters the crystal grain boundary of the $HfO_2$ film of a polycrystalline film. This causes in-plane variation in dielectric constant and gate leakage current.

In addition to the technical problems with the structure disclosed in Document 1, the structure disclosed in Document 2 has a work function control range of 0 to 0.2 eV with a high-dielectric film containing Hf, and therefore, can be implemented in very specific circumstances.

SUMMARY OF THE INVENTION

The present invention has been made in view of these circumstances, and an object thereof is to provide a semiconductor device that has a lower leakage current and an optimum threshold value, and a method for manufacturing such a semiconductor device.

A semiconductor device according to a first aspect of the present invention includes: a substrate; an n-channel MIS transistor including: a p-type semiconductor region formed on the substrate; first source/drain regions being formed in the p-type semiconductor region and being separated from each other; a first gate insulating film having an amorphous layer or an epitaxial layer formed on the p-type semiconductor region between the first source/drain regions; and a first gate electrode having a stack structure formed with a first metal layer and a first compound layer, the first metal layer being formed on the first gate insulating film and being made of a first metal having a work function of 4.3 eV or smaller, the first compound layer being formed on the first metal layer and containing a compound of a second metal and a IV-group semiconductor, and the second metal being different from the first metal; and a p-channel MIS transistor including: an n-type semiconductor region formed on the substrate and isolated from the p-type semiconductor region; second source/drain regions being formed in the n-type semiconductor region and being separated from each other; a second gate insulating film formed on the n-type semiconductor region between the second source/drain regions; and a second gate electrode being formed on the second gate insulating film and having a second compound layer containing a compound of the same composition as the first compound layer.

A semiconductor device according to a second aspect of the present invention includes: a substrate; an n-channel MIS transistor including: a p-type semiconductor region formed on the substrate; first source/drain regions being formed in the p-type semiconductor region and being separated from each other; a first gate insulating film having an amorphous layer or an epitaxial layer formed on the p-type semiconductor region between the first source/drain regions; and a first gate electrode being formed on the first gate insulating film and including a first compound layer containing a compound of a metal and a IV-group semiconductor; and a p-channel MIS transistor including: an n-type semiconductor region formed on the substrate and isolated from the p-type semiconductor region;

second source/drain regions being formed in the n-type semiconductor region and being separated from each other; a second gate insulating film formed on the n-type semiconductor region between the second source/drain regions; and a second gate electrode including an Au layer formed on the second gate insulating film and a second compound layer formed on the Au layer, the second compound layer containing a compound having the same composition as the first compound layer.

A method for manufacturing a semiconductor device according to a third aspect of the present invention includes: forming a first gate insulating film on a p-type semiconductor region formed on a substrate, while forming a second gate insulating film on an n-type semiconductor region being formed on the substrate and being isolated from the p-type semiconductor region; forming a first layer containing a IV-group semiconductor on the first and second gate insulating films; forming a second layer containing the IV-group semiconductor over the p-type semiconductor region and a third layer containing the IV-group semiconductor over the n-type semiconductor region by processing the first and second gate insulating films and the first layer; forming first source/drain regions at the p-type semiconductor region located on both sides of the second layer; forming second source/drain regions at the n-type semiconductor region located on both sides of the third layer; forming films made of a first metal on the second and third layers and carrying out a heat treatment to form first and second compound layers that contain compounds of the first metal and the IV-group semiconductor contained in the second and third layers respectively; adding a second metal having a smaller work function than 4.3 eV to the first compound layer; and forming a layer made of the second metal at an interface between the first compound layer and the first gate insulating film by carrying out a heat treatment.

A method for manufacturing a semiconductor device according to a fourth aspect of the present invention includes: forming a first gate insulating film on a p-type semiconductor region formed on a substrate, while forming a second gate insulating film on an n-type semiconductor region being formed on the substrate and being isolated from the p-type semiconductor region; forming a first layer containing a IV-group semiconductor on the first and second gate insulating films; forming a second layer containing the IV-group semiconductor over the p-type semiconductor region and a third layer containing the IV-group semiconductor over the n-type semiconductor region by processing the first and second gate insulating films and the first layer; forming first source/drain regions at the p-type semiconductor region located on both sides of the first layer; forming second source/drain regions at the n-type semiconductor region located on both sides of the second layer; forming first films made of a first metal on the second and third layers and carrying out a heat treatment to form first and second compound layers that contain compounds of the first metal and the IV-group semiconductor contained in the second and third layers respectively; adding Au to the second compound layer; and forming an Au layer at an interface between the second compound layer and the second gate insulating film by carrying out a heat treatment.

A method for manufacturing a semiconductor device according to a fifth aspect of the present invention includes: forming a first gate insulating film on a p-type semiconductor region formed on a substrate, while forming a second gate insulating film on an n-type semiconductor region being formed on the substrate and being isolated from the p-type semiconductor region; forming a first layer containing a IV-group semiconductor on the first and second gate insulating films; forming a second layer containing the IV-group semiconductor over the p-type semiconductor region and a third layer containing the IV-group semiconductor over the n-type semiconductor region by processing the first and second gate insulating films and the first layer; forming first source/drain regions at the p-type semiconductor region located on both sides of the first layer; forming second source/drain regions at the n-type semiconductor region located on both sides of the second layer; forming first films made of a first metal on the second and third layers and carrying out a heat treatment to form first and second compound layers that contain compounds of the first metal and the IV-group semiconductor contained in the second and third layers respectively; depositing a second film made of a second metal having a smaller work function than 4.3 eV on the first compound layer; and forming a metal layer made of the second metal at an interface between the first compound layer and the first gate insulating film by carrying out a heat treatment.

DETAILED DESCRIPTION OF THE INVENTION

Figure 1:
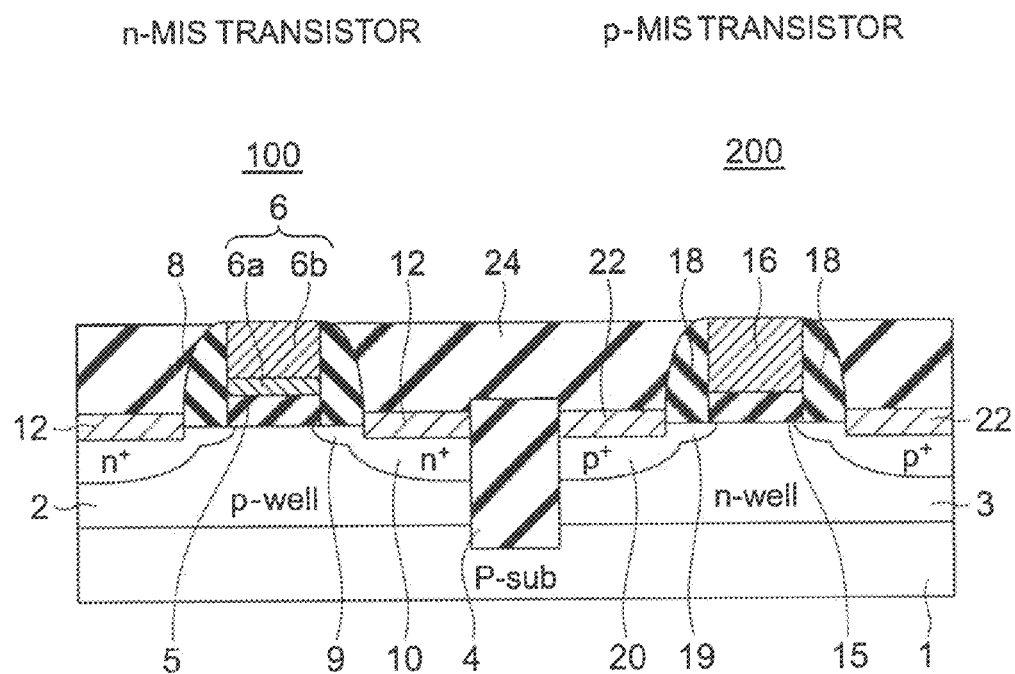
FIG. 1 is a cross-sectional view of a CMISFET in accordance with a first embodiment of the present invention.

The following is a description of embodiments of the present invention, with reference to the accompanying drawings. Like components are denoted by like reference numerals in the drawings, and explanation of them will not be made more than once in the following. Each of the drawings is a schematic view drawn for ease of explanation, and the shapes, sizes, and proportions shown therein might be different from those of actual devices. However, they may be changed or modified, with the following description and the conventional techniques being taken into account.

First Embodiment

A semiconductor device in accordance with a first embodiment of the present invention is described. The semiconductor device of this embodiment is a CMOSFET, and a section in the gate length direction of the semiconductor device is shown in FIG. 1.

As shown in FIG. 1, a p-type well region 2 and an n-type well region 3 are formed in a p-type silicon substrate 1, and the well regions 2 and 3 are electrically insulated from each other by a device isolation layer 4. An n-channel MIS (Metal-Insulator-Semiconductor) transistor 100 is formed in the p-type well region 2, and a p-channel MIS transistor 200 is formed in the n-type well region 3.

The n-channel MIS transistor 100 includes: a gate insulating film 5 formed over the p-type well region 2; a gate electrode 6 formed on the gate insulating film 5; gate sidewalls 8 that are formed on the sides of the gate electrode 6 and are made of an insulating material; n-type extension layers 9 that are formed in the p-type well region 2 and are located on both sides of the gate electrode 6; n-type diffusion layers 10 that are formed in the p-type well region 2 and are located on both sides of the gate sidewalls 8; and Ni silicide layers 12 that are formed on the n-type diffusion layers 10 and are made of NiSi. The gate electrode 6 has a stack structure of an Al layer 6a formed on the gate insulating film 5 and a silicide layer 6b formed on the Al layer 6a. The n-type diffusion layers 10 are designed to have deeper junctions with the p-type well region 2 than the n-type extension layers 9. The n-type diffusion layers 10 and the n-type extension layers 9 form the source/drain regions of the n-channel MIS transistor 100.

The p-channel MIS transistor 200 includes: a gate insulating film 15 formed over the n-type well region 3; a gate electrode 16 formed on the gate insulating film 15; gate sidewalls 18 that are formed on the sides of the gate electrode 16 and are made of an insulating material; p-type extension layers 19 that are formed in the n-type well region 3 and are located on both sides of the gate electrode 16; p-type diffusion layers 20 that are formed in the n-type well region 22 and are located on both sides of the gate sidewalls 18; and Ni silicide layers 22 that are formed on the p-type diffusion layers 20 and are made of NiSi. The p-type diffusion layers 20 are designed to have deeper junctions with the n-type well region 3 than the p-type extension layers 19. The p-type diffusion layers 20 and the p-type extension layers 19 form the source/drain regions of the p-channel MIS transistor 200. The n-channel MIS transistor 100 and the p-channel MIS transistor 200 are covered with an interlayer insulating film 24.

The gate insulating films 5 and 15 are made of HfSiON having interfaces in amorphous states at least with the gate electrodes 6 and 16. Each of the gate insulating films 5 and 15 should preferably have a physical film thickness of 5 nm or smaller. The film thickness of the Al layer 6a of the gate electrode 6 is 1 monolayer. The silicide layer 6b of the gate electrode 6 is formed with cubic crystals of $Ni_3Si$. Meanwhile, the gate electrode 16 is formed with cubic crystals of $Ni_3Si$, like the silicide layer 6b of the gate electrode 6. In FIG. 1, the entire gate electrode 16 is a crystalline phase of $Ni_3Si$. However, the work function is not affected, as long as a crystalline phase of $Ni_3Si$ is formed as a layer at the interface between the gate electrode 16 and the gate insulating film 15. The same applies to the silicide layer 6b of the gate electrode 6. It should be noted here that the silicide layer 6b of the gate electrode 6 and the gate electrode 16 must have the same structures.

The distance between the source and drain (the gate length) of each of the gate structures formed with the gate insulating films 5 and 15 and the gate electrodes 6 and 16 is preferably 30 nm or less.

The n-channel MIS transistor and the p-channel MIS transistor work in a complementary fashion, and constitute a CMIS device.

In this embodiment, the gate electrodes have different effective work functions Φeff, so as to optimize the threshold voltages in accordance with the conductivity types. As in this embodiment, the n-channel MIS transistor 100 formed on the silicon substrate 1 preferably has a smaller effective work function Φeff than the mid gap of Si, while the p-channel MIS transistor 200 preferably has a larger effective work function Φeff than the mid gap of Si. More specifically, in a transistor to perform high-speed operations with low threshold voltages, an n-type device should have an effective work function Φeff of 4.4 eV, and a p-type device should have an effective work function Φeff of 4.8 eV or larger, so as to readily achieve a low threshold voltage of 0.5 eV or lower. Here, an "effective work function Φeff" is the work function of a gate electrode at an interface with a gate insulating film. The flat band voltage Vfb obtained in a case where the film thickness of an oxide film is 0 due to the dependence of a flat band voltage Vfb determined by the C-V characteristics of a MIS capacitor on the film thickness of a gate oxide film is extracted by virtue of a linear extrapolation value. The effective work function Φeff of the electrode is then extracted in accordance with the Fermi level of the Si substrate determined by the impurity concentration ($1\times10^{15}$ cm$^{-3}$, for example) of the Si substrate.

The value of an effective work function Φeff is determined by the Fermi level of the interface with a gate electrode in contact with a gate insulating film. In the n-channel MIS transistor 100 of this embodiment, the gate electrode 6 in contact with the gate insulating film 5 is the Al layer 6a, and the effective work function Φeff of the Al layer 6a is 4.3 eV. Accordingly, a low threshold voltage can be achieved. In the p-channel MIS transistor 200, the gate electrode 16 in contact with the gate insulating film 15 is made of Ni$_3$Si, and the effective work function Φeff of the gate electrode 16 is 4.85 eV, which is a suitable effective work function Φeff for achieving a low threshold voltage in the p-channel MIS transistor. When an effective work function Φeff is extracted in this embodiment, only the fixed charges at the interface between SiO$_2$ and the Si substrate are subtracted from the dependence of the flat band voltage Vfb on the film thickness of an oxide film. In this embodiment, no fixed charges supposedly exist in the gate insulating films 5 and 15. In reality, fixed charges exist in films, though the fixed charge amount in terms of areal density is ten or more times lesser than the interface fixed charge amount. The effective work function Φeff extracted based on such a fixed charge amount is nonetheless suitable for achieving a low threshold voltage, though there is an error of about 0.05 eV.

The Al distribution at the interface between the gate electrode 6 and the gate insulating film 5 of this embodiment does not cause Al diffusion deep into the gate insulating film or toward the Si substrate 1. This is because the gate insulating film 5 is an amorphous layer or an epitaxial layer.

As in Document 1, in a case where a gate insulating film having a polycrystalline structure is employed, Al having a high grain boundary diffusion speed runs along the crystal grain boundaries, and forms defects in the gate insulating film. As a result of this, the transistor operation becomes unstable. Also, Al might reach the Si channel region, resulting in poorer device reliability.

In this embodiment, on the other hand, the gate insulating film 5 made of HfSiON, which is an amorphous material having no crystal grain boundaries, is employed so as to restrain Al diffusion into the gate insulating film and the channel region. As a result, Al ions pile up rapidly at the interface, and the depth of the Al ingress into the gate insulating film 5 can be restricted to such a degree as not to adversely affect the transistor operations. Alternatively, an epitaxial film having no crystal grain boundaries may be employed as the gate insulating film 5, so as to restrain Al ingress into the gate insulating film.

Although a HfSiON film is used as the gate insulating film 5 in the structure shown in FIG. 1, an insulating material having a higher dielectric constant than the HfSiON film (a high-dielectric insulating film) may be employed. However, the gate insulating film needs to be an amorphous layer or an epitaxial layer that is matched to the Si substrate, and cannot have a polycrystalline structure. This is because, if the gate insulating film has a polycrystalline structure, the Al layer that is the lower layer of the gate electrode enters the polycrystalline grain boundaries of the gate insulating film or the interface with the channel region during the post-processing procedure of the manufacturing of the device, since the diffusion speed of Al along crystal grain boundaries is ten or more times higher than the diffusion speed of Al among crystal grains. In such a case, the gate leakage current becomes higher or the reliability becomes poorer. In a case where the gate insulating film has an amorphous or epitaxial structure having no crystal grain boundaries, Al enters a very shallow region of the electrode interface with the gate insulating film, but the depth of the ingress can be restricted to less than a half of the film thickness of the gate insulating film. Thus, the above described problems are not caused.

Other than a silicon oxide film made of HfSiON, the gate insulating film may be a film made of a high-dielectric material such as Si$_3$N$_4$, Al$_2$O$_3$, Ta$_2$O$_5$, TiO$_2$, La$_2$O$_5$, CeO$_2$, ZrO$_2$, HfO$_2$, SrTiO$_3$, or Pr$_2$O$_3$. However, to obtain the above described amorphous or epitaxial structure with each of those materials, a silicate formed by adding metal ions to a silicon oxide is also effective, and a combination of those materials, such as a LaAl oxide, may be used. In any case, a material having necessary heat resistance for the generation of the transistor and its manufacturing process should be selected.

Although a HfSiON film is used as the gate insulating film in the following embodiments, it is of course possible to replace the HfSiON film with a high-dielectric insulating film, unless otherwise specifically noted. As the Al layer is formed as an interface, the gate insulating film is preferably made of a material that has a larger Gibbs free energy than Al$_2$O$_3$ and is thermodynamically stable. In such a case, reduction of the gate insulating film due to Al is restrained, and the amount of Al entering the insulating film is reduced. Accordingly, with a smaller amount of Al being added, an Al layer can be effectively formed as the first layer on the electrode side that contributes to the work function of the electrode. More specifically, a gate insulating film that contains Hf and La and has an amorphous or epitaxial structure is preferable. Also, the composition ratio of those metal elements is made higher in the vicinity of the interface with the gate insulating film, so as to effectively restrain Al ingress into the insulating film. However, if the Hf composition ratio is increased at the interface with the gate electrode, it is necessary to control the metal-silicon or metal-germanium composition of the electrode, in view of the later described Fermi level phenomenon. The gate insulating film may include an interface layer made of SiO$_2$ or the like on the substrate side.

Figure 3:
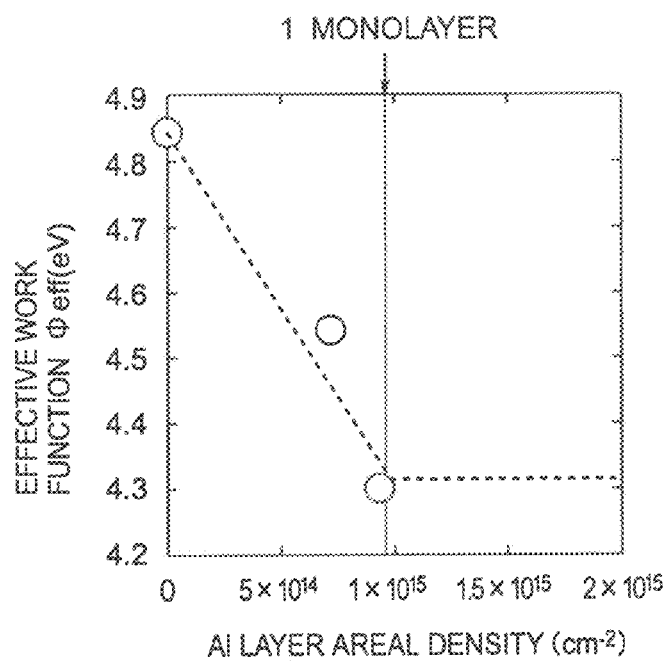
FIG. 3 shows the relationship between the effective work function of the silicide electrode and the film thickness of the Al layer in the first embodiment.

If a high threshold voltage is required in the device, a material having a smaller effective work function Φeff than Ni$_3$Si used in this embodiment, such as a Ni$_2$Si crystalline phase, is used for the gate electrode 16 of the p-channel MIS transistor, and the areal density and the film thickness of the Al layer of the n-type transistor is adjusted to one monolayer or smaller so that a desired effective work function Φeff can be obtained, as in the example case shown in FIG. 3. The effective work function Φeff of the n-type transistor is controlled in this manner. The effective work function Φeff of Ni$_2$Si is 4.75 eV. In a case where the electrode 6b is made of a different material from Ni$_3$Si, the effective work function Φeff is minimized also in the Al region of 1 monolayer or greater in film thickness. However, in the regions where the Al areal density is smaller than one monolayer, the relationship between the effective work function Φeff and the Al amount varies with the value of the effective work function Φeff of the electrode 6b of the n-type transistor. To control the Al layer thickness in a simple manner, the amount of Al to be implanted is reduced as described later.

The heights of the gate electrodes 6 and 16, or the film thicknesses of the silicide layers, are preferably 100 nm or less, and need to be reduced as the gate length is reduced. If the gate electrodes 6 and 16 are too tall for the gate length, the mechanical strength becomes insufficient, and cannot maintain the structure during the manufacturing process. This hinders proper device manufacturing. Typically, the height of each of the gate electrodes 6 and 16 should be two or three times greater than the gate length. If the gate electrodes 6 and 16 are too short, the sheet resistance value required for each gate electrode is not obtained, resulting in degradation of device characteristics. Therefore, the gate electrodes 6 and 16 need to be tall enough to achieve the required sheet resistance according to the device technology generation, and should be 20 nm tall or more.

Although $Ni_3Si$ phases as silicide materials are used for the upper layer 6b of the gate electrode 6 and the gate electrode 16 in this embodiment, any other compound of a metal having a larger effective work function $\Phi eff$ than the mid gap of Si and a IV-group semiconductor, such as a silicide material, a germanide material, or a carbide material, may be employed. Alternatively, mixed crystals of those materials may be employed. As mentioned later, those materials have excellent compatibility with the existing transistor manufacturing processes. More specifically, in a case where a silicide or germanide is employed, polycrystalline silicon or germanium that excels in high-temperature heat resistance is used for the gate electrodes during high-temperature procedures such as the procedures for forming source/drain bonding, since a silicide or germanide can be formed through a solid-phase reaction between a metal and silicon or germanium. A silicide or germanide can be formed thereafter. Accordingly, an increase in leakage current and deterioration of electric characteristics due to the interfacial reaction at the interface between each silicide or germanide electrode and the insulating film can be restrained. If the heat resistance of the germanide is insufficient, silicon germanium that is mixed crystals of silicon and germanium, or silicon germanium carbon formed by adding carbon to silicon germanium is used for the gate electrodes during the high-temperature procedures, and a solid-phase reaction is caused between the gate electrodes and a metal. In this manner, a germanosilicide or germanosilicide carbon is formed. If the carbon additive amount is too large, however, the solid-phase reaction temperature increases, and a reaction cannot be caused at a suitable temperature for transistor formation. Therefore, the carbon additive amount is preferably 5 atomic % or less. Specific examples of materials other than the above include $Ni_{31}Si_{12}$, $NiGe$, $Ni_2Ge$, $Ni_5Ge_3$, $PtSi$, $Pt_2Si$, $Pt_3Si$, $PtGe$, $Pt_2Ge$, $Pd_2Si$, $PdGe$, $IrSi$, and $IrGe$, containing Ni, Pt, Pd, or Ir. To obtain a low electrical resistivity required for gate electrodes, NiGe, PtSi, PtGe, and $Pd_2Si$ are particularly preferred. Each of the above metal elements may contain two kinds of metals mixed therein. In such a case, to restrain threshold value variations, one of the metals needs to be 20% or less with respect to the other one. For example, Pt to be added to Ni should be 20% or less in amount with respect to the Ni amount. In the existing CMIS transistors, NiSi having a low resistivity is used for the silicide phases formed on the source/drain regions. Accordingly, the Ni silicides are the most preferable among the above materials, since a new material or production equipment is not necessary, the silicide phases can be formed at the same time as the source/drain formation, and the production and development costs can be lowered. Particularly, $Ni_3Si$ can be formed, not depending on the gate length of the transistor, while the composition variation is restrained. This is because $Ni_3Si$ is the Ni silicide having the highest Ni composition ratio. In a case where NiSi phases are to be formed simultaneously in transistors having different gate lengths through a solid-phase reaction between polycrystalline Si and a Ni film as described later, a $Ni_2Si$ phase is formed in the transistor having the smaller gate length. This is because a larger amount of Ni than the necessary Ni amount for the desired NiSi formation is provided as Ni enters through the interlayer film, and this phenomenon is more prominent in the transistor having the smaller gate length. In a case where $Ni_3Si$ is formed, on the other hand, a phase change is not caused even if Ni is supplied later. Thus, uniform $Ni_3Si$ phases can be formed in transistors having different gate lengths from each other.

If the gate insulating film contains Hf, the metal composition ratio of the gate electrode is preferably higher than that of silicon or germanium, so as to achieve a low threshold voltage in the p-type transistor. This is because a decrease in effective work function $\Phi eff$ due to the Fermi level pinning by the Hf—Si or Hf—Ge caused at the interface with the Hf-containing insulating film. As the silicon or germanium composition ratio at the interface on the electrode side is higher, the influence of the pinning is greater, and the effective work function $\Phi eff$ drops to the neighborhood of the Si mid gap. This phenomenon becomes prominent when the Hf composition ratio is 30% or more. However, when the Hf composition ratio is lower than that, the pinning phenomenon affects the effective work function $\Phi eff$, as long as a HF—Si or Hf—Ge bond exists at the interface. Accordingly, the silicon or germanium composition ratio at the interface is lowered by increasing the metal composition ratio, so as to avoid the adverse influence of the pinning phenomenon. Here, the metal composition ratio is preferably two or more times higher than the silicon or germanium composition ratio. Alternatively, a layer that does not contain Hf or has a low Hf composition ratio may be formed on the gate electrode side of the gate insulating film, so as to avoid the above problem without the above described composition ratios.

Having a high melting point, a carbide material does not cause an increase in leakage current or degradation of reliability even if it is formed on the gate insulating film during the high-temperature procedure. Accordingly, a carbide material can be formed through the same manufacturing procedures as those for a conventional polycrystalline silicon gate electrode. Preferred examples of an metal that can be contained in a carbide material is Ta, Ti, Hf, Zr, Mo, or W. However, the effective work function $\Phi eff$ of a carbide material is varied by approximately 1 eV due to the metal-carbon composition or the crystalline orientation. Therefore, when a carbide material is used for a gate electrode, the effective work function $\Phi eff$ of the carbide material needs to be adjusted to a value greater than the Si mid gap.

Figure 4:
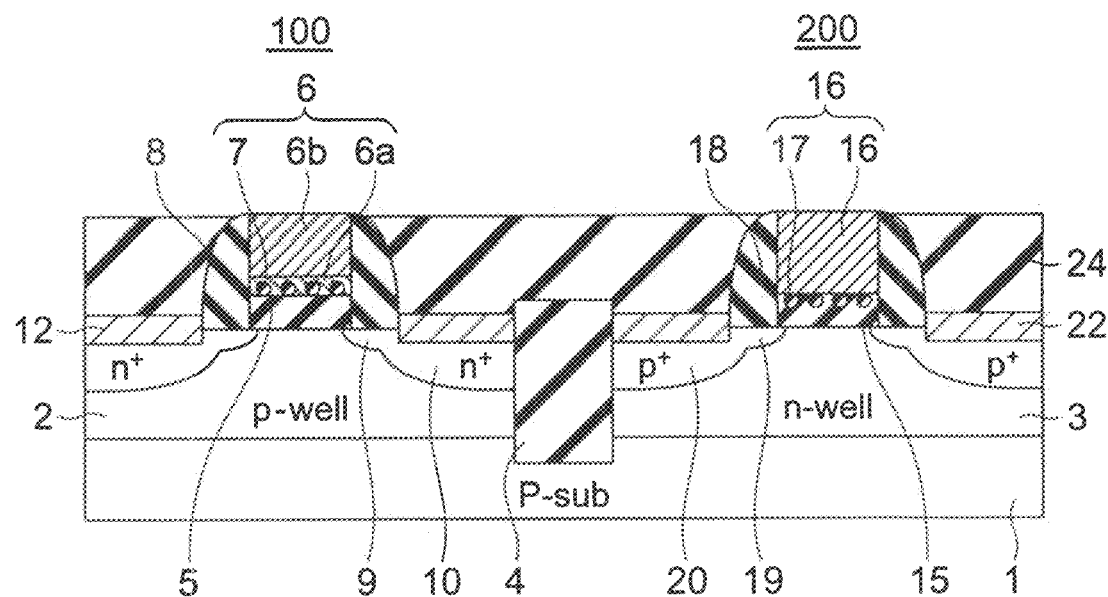
FIG. 4 is a cross-sectional view of a CMISFET in accordance with a first modification of the first embodiment.

As in a first modification of this embodiment shown in FIG. 4, it is of course effective to adjust the value of the effective work function $\Phi eff$ to a desired effective work function $\Phi eff$ by adding a nonmetallic element such as phosphorus 7 to the interface with the gate electrode 6 of the n-channel MIS transistor and adding a nonmetallic element such as boron 17 to the interface with the gate electrode 16 of the p-channel MIS transistor in the semiconductor device of this embodiment. Boron is easily segregated at the interface with an insulating film. As boron is segregated at the interface between the $Ni_3Si$ electrode 16 and the gate insulating film 15, the effective work function $\Phi eff$ can be increased by approximately 0.3 eV at a maximum, and the variation is proportional to the boron areal density at the interface. Meanwhile, phosphorus can be easily segregated at the interface on the electrode side, and, unlike boron, reduces the effective work function $\Phi eff$ by approximately 0.45 eV at a maximum. Arsenic or antimony has the same effects as phosphorus. Phosphorus and boron are used in the n-type and p-type transistors of this embodiment, so that the effective work functions $\Phi eff$ become 5.15 eV and 4.0 eV, which are the same as the effective work functions of conventional polycrystalline silicon electrodes. In this case, phosphorus in the n-type transistor is mostly segregated at the interface between the Al layer 6a and the HfSiON film 5, and exhibits the above described effect of modulating the effective work function Φeff. This proves that a device having a low threshold voltage can be produced by the same channel impurity engineering as that for conventional transistors, and can reduce the costs for the device development. The above described nonmetallic elements change the values of the effective work functions Φeff of the gate electrodes by forming interface electric double-layers as a result of segregation at each interface between a gate electrode and an insulating film. In this case, the values of the effective work functions Φeff of the gate electrodes are modulated uniformly in space. Accordingly, there are no concerns about variations of transistor threshold values that are normally caused by the difference between work functions due to different metal elements, as in a later described case where two or more kinds of metal elements exist (U.S.P. Application Publication No. 2005/0037580).

In this embodiment, the layer of the gate electrode 6 in contact with the gate insulating film 5 above the p-type well region 2 is the aluminum layer 6a. However, the aluminum layer 6a may be replaced with a layer made of some other metal material having a melting point at 650° C. or lower and a vacuum work function of 4.3 eV or smaller. The vacuum work function in this case is a value that is measured by photoelectron spectroscopy and is defined by H. B. Michaelson, JAP 48, 4729 (1977). As will be described later in detail in the description of the manufacturing method, such metal materials rapidly diffuse in electrodes, having low melting points. Accordingly, the metal materials can be easily diffused and segregated at the interfaces between the gate electrodes and the insulating films. Thus, the structure of this embodiment can be readily formed with those metal materials. More specifically, In, Ga, or Tl may be used in place of Al. To achieve high heat resistance, Al is preferred, having the highest melting point (660° C.) among those metal materials. However, metal materials other than the above materials may be used by reducing the production process temperature in the LSI wiring regions. To adjust threshold values, In and Tl having smaller vacuum work functions (4.12 eV and 3.84 eV, respectively) are preferred. To restrain variations of transistor threshold values, the layer of the gate electrode 6 in contact with the gate insulating film 5 needs to be made of only one metal material. In U.S.P. Application Publication No. 2005/0037580, when an In plating film is formed, Al and Ga are contained in the electrode. At the time of In diffusion in this case, the contained elements also reach the interface with the gate insulating film, due to the heat generated in the LSI wiring process. As a result, two different kinds of metal elements having different work functions coexist at the interface. The difference between the vacuum work function of Al and the vacuum work function of Sb is as large as 0.18 eV. This vacuum work function difference causes S-factor degradation due to the variation in threshold value in the same transistor. The difference also directly affects the variations of threshold values between transistors, and the variation amount is as large as 10% to 20% of the source voltage, resulting in an abnormal operation of the integrated circuit. Therefore, the layer in contact with the gate insulating film 5 in this embodiment should be made of one metal material, so as to effectively restrain such threshold value variations.

The grain size in the gate electrodes 6b and 16 is preferably ½ of the gate length or smaller, so as to restrain variations of effective work functions Φeff.

Since this embodiment can provide work functions especially suitable for achieving low threshold voltages in transistors formed on a bulk substrate as described above, the substrate is preferably a bulk substrate as shown in FIG. 1.

Although Si is used in the channel regions in this embodiment, it is also possible to use SiGe, Ge, or biased Si having higher mobility than Si.

Also, the source/drain regions 10 and 20 in this embodiment are formed with high-impurity silicon layers that are also used in conventional transistor structures. However, Schottky source/drain structures having silicides in place of the silicon layers may be employed, or segregation Schottky structures having impurities segregated at the interfaces between the silicides and the silicon substrate may also be effectively employed. According to the device generation, optimum source/drain structures should be selected.

Figure 5:
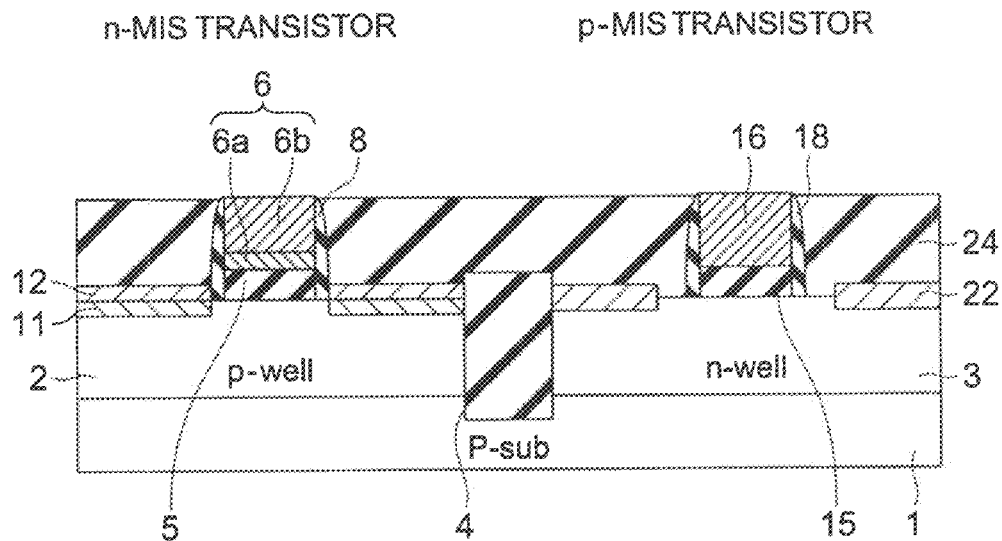
FIG. 5 is a cross-sectional view of a CMISFET in accordance with a second modification of the first embodiment.
Figure 6:
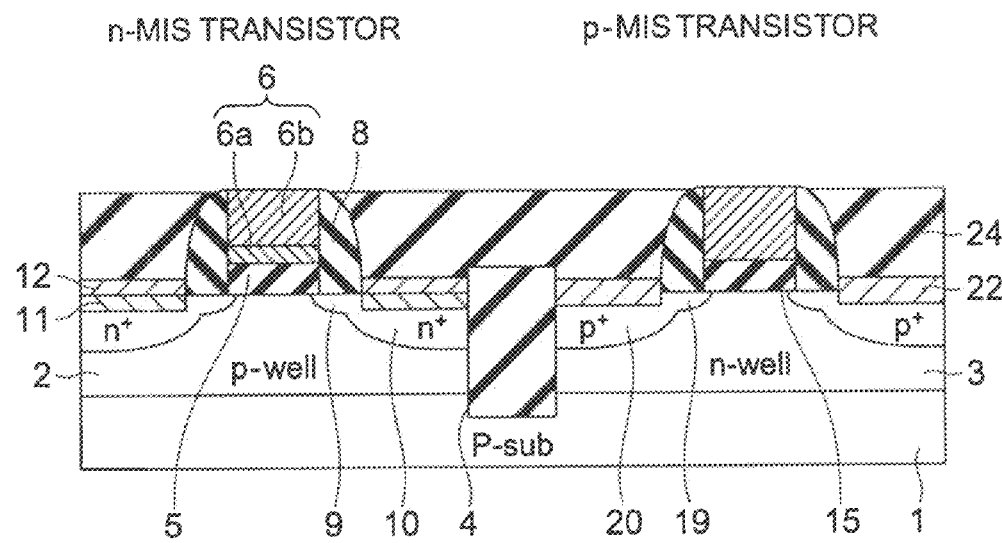
FIG. 6 is a cross-sectional view of a CMISFET in accordance with a third modification of the first embodiment.

Also, as shown in FIGS. 5 and 6, a metal material layer having a smaller vacuum work function than 4.3 eV may be provided at the interfaces between the source/drain regions in the n-type transistor region and the silicide layers 12 formed above the source/drain regions. FIG. 5 shows a Schottky transistor in accordance with a second modification of this embodiment. FIG. 6 shows a transistor structure having conventional diffusion layers in accordance with a third modification of this embodiment. In the Schottky transistor of the second modification, the source/drain regions of the n-channel MIS transistor are formed with Al layers 11 and silicide layers 12, and the source/drain regions of the p-channel MIS transistor are formed with silicide layers 22. Other than that, the second modification is the same structure as the first embodiment. In the third modification, the source/drain regions of the n-channel MIS transistor are formed with Al layers 11 and silicide layers 12. Other than that, the third modification is the same as the first embodiment. In such cases, the Schottky barrier height for electron is reduced, and the contact resistance is lowered for either of the source/drain structures. Thus, transistor operations can be performed at higher speeds.

(Manufacturing Method: Al Ion Implantation)

Figure 7:
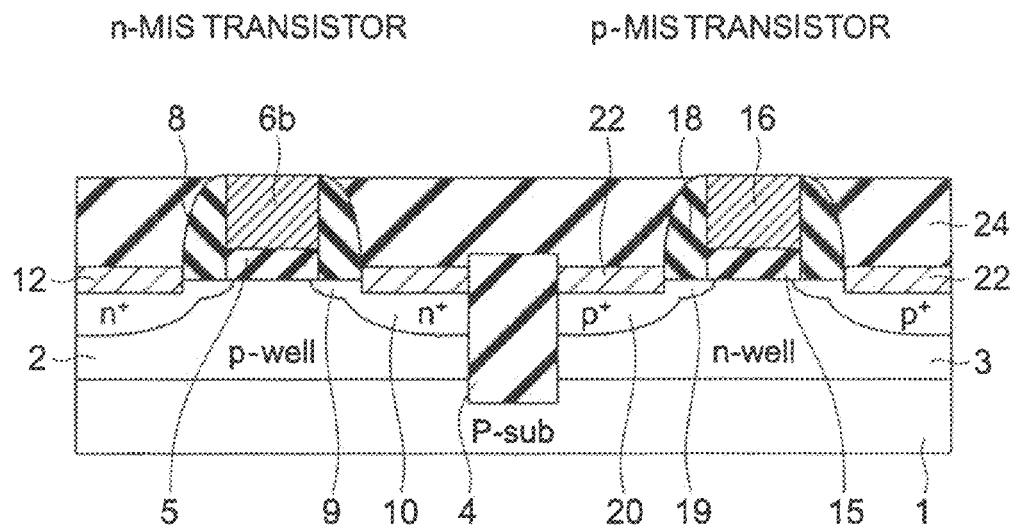
FIGS. 7 to 9 are cross-sectional views showing a procedure for manufacturing the CMISFET in accordance with the first embodiment.
Figure 8:
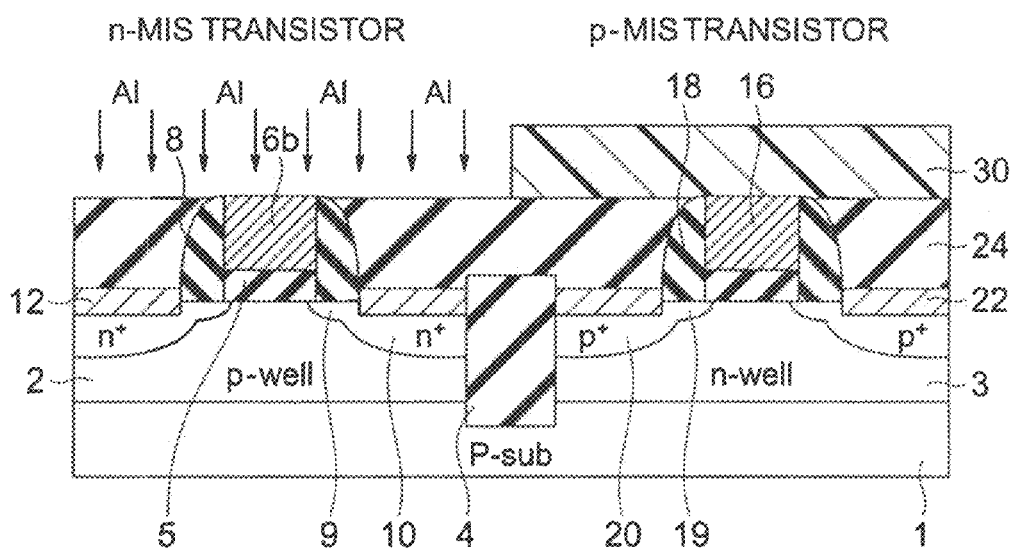
Figure 9:
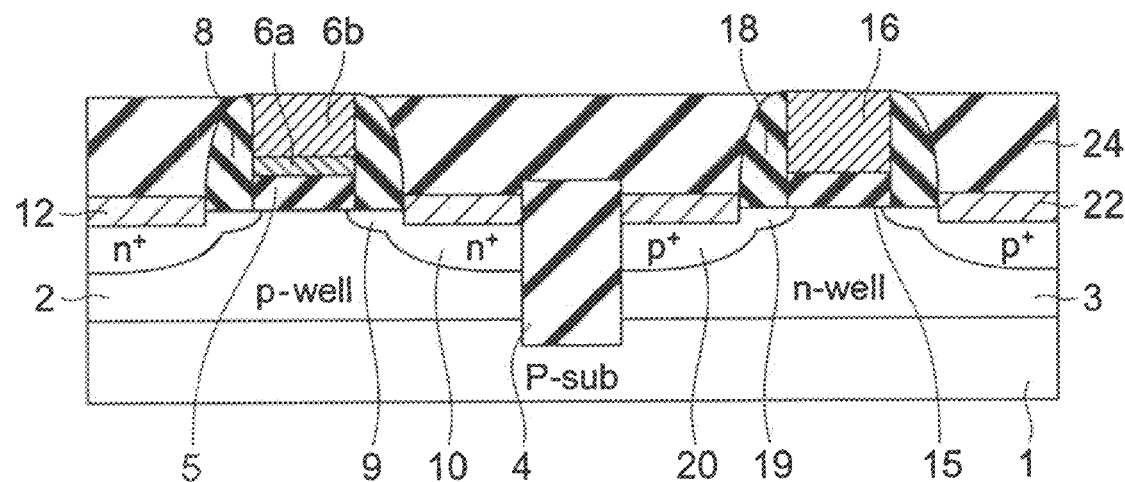

Referring now to FIGS. 7 through 9, a method for manufacturing the semiconductor device of the first embodiment is described.

The device isolation layer 4 may be formed by local oxidation or the shallow trench method (STI), and may have a mesa shape. After the device isolation layer 4 is formed in the silicon substrate 1, the p-type well region 2 and the n-type well region 3 are formed through ion implantation (see FIG. 7).

Next, the HfSiON films 5 and 15 to be used as the gate insulating films are formed on the surface of the silicon substrate 1 by MOCVD. In a case where high-dielectric films are to be formed, a film forming method other than MOCVD, such as ALD, may be used, and Si or N may be added to the high-dielectric films as in the case of HfSiON (see FIG. 7).

A 50-nm thick polycrystalline silicon layer to be used as the gate electrodes is deposited, and a 10-nm thick SiN cap layer (not shown) is deposited on the polycrystalline silicon layer by low-pressure CVD. Patterning is then performed by a lithography technique, and anisotropic etching is performed so as to adjust the shapes of the gate electrodes.

Phosphorus and boron ion implantation is then performed so as to form the shallow extension layers 9 and 19 with high impurity concentrations in the n-type and p-type MIS transistors (see FIG. 7). To form the extension layers 9 and 19, an elevated source/drain structure that can restrain a short-channel effect as the device characteristics can be formed by the selective epitaxial growth method. When such an elevated source/drain structure is formed, impurities may be introduced at the same time.

Next, the sidewalls 8 and 18 for insulating the gate electrodes from the source/drain regions are formed (see FIG. 7).

Phosphorus and boron ion implantation is performed with a higher acceleration voltage than before, so as to form the deep diffusion layers 10 and 20. A 8-nm thick Ni film is formed by sputtering, and a heat treatment is carried out at 400° C., so as to form the NiSi contact layers 12 and 22 over the source/drain regions 10 and 20 (see FIG. 7). Selective etching is then performed on the unreacted Ni in the other regions with a $H_2SO_4$ solution, so as to selectively form NiSi only on the source/drain regions 10 and 20.

The cap layers made of SiN on the gate electrodes are then removed, and a silicon oxide film to be the interlayer insulating film 24 is deposited by low-pressure CVD. The top ends of the gate electrodes are then exposed by CMP (chemical mechanical planarization) (see FIG. 7). A 85-nm thick Ni film is formed by sputtering, and a low-temperature heat treatment is carried out at 500° C., so as to form silicide layers in the interface regions between the Ni and the polycrystalline Si. In this manner, the 110-nm thick gate electrodes 6b and 16 of $Ni_3Si$ phases are formed for the transistors of both conductivity types (see FIG. 7). If the film thickness of the Ni film is made 50 nm and the Ni—Si ratio is controlled here, a $Ni_2Si$ crystalline phase is formed. If the film thickness of the Ni film is made 30 nm and the Ni—Si ratio is controlled, a NiSi crystalline phase is formed. Also, the heat treatment for the silicide formation is preferably carried out in two stages, and wet etching for removing the unreacted Ni is performed between the two stages. In this manner, excess Ni existing on the gate sidewalls is prevented from flowing into the gate electrodes, and silicide layers of the same Ni—Si compositions can be formed simultaneously in transistors with different gate lengths. As a result, variations in threshold voltage can be restrained. In this case, the heat treatment in the first stage is preferably carried out at temperatures ranging from 300° C. to 450° C. for one minute. If the heat treatment in the first stage is carried out at a temperature of 500° C. or higher, the excess Ni flows into the gate electrodes as described above. The heat treatment in the second stage needs to be carried out at temperatures ranging from 400° C. to 600° C. If the temperature is higher than 600° C., the gate electrodes are broken due to aggregation of the Ni silicide film. As a result, the electric resistance of the gate electrodes is increased, and a defective transistor operation is caused.

Next, only the n-channel MIS transistor formation region is exposed by a lithography technique, as shown in FIG. 8. Meanwhile, the p-channel MIS transistor formation region is covered with a resist or a hard mask 30. Al ion implantation is then performed so as to add Al only to the gate electrode 6b of the n-channel MIS transistor. The Al dose amount is $1 \times 10^{16}$ $cm^{-2}$, and the acceleration voltage is 10 keV. As mentioned in First Embodiment, the dose amount is adjusted to the optimum amount, so that the Al layer 6a has a necessary film thickness and concentration for a desired effective work function $\Phi$eff. The acceleration energy should be so low that Al ions cannot reach the gate insulating film 5. Typically, the mean Al ion range needs to be within ⅔ of the height of the gate electrode 6b from the upper surface of the gate electrode 6b. If Al ions are implanted with a higher acceleration voltage than that, Al ions are implanted directly into the gate insulating film 5, resulting in an increase in gate leakage current and poorer reliability. If the acceleration voltage is even higher than that, Al ions are added to the channel, resulting in poorer carrier mobility. As a result, the device characteristics deteriorate. A heat treatment is then carried out at 500° C. for one hour, so as to segregate Al ions at the interface between the gate electrode 6b and the gate insulating film 5 and form the Al layer 6a (see FIG. 9).

Figure 10:
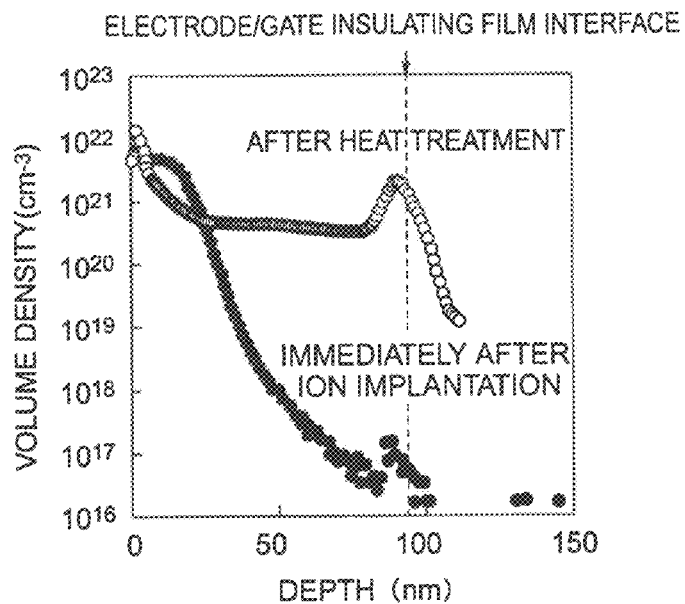
FIG. 10 shows the Al distribution in the electrode before and after the heat diffusion in the CMISFET in accordance with the first embodiment.

Al does not form a compound with silicon or germanium. Accordingly, the Al ions implanted into the gate electrode 6b are discharged to the crystal grain boundaries, and run along the crystal grain boundaries. As a result, the Al ions are precipitated at the interface between the gate electrode and the insulating film, and on the surface. The effective work function $\Phi$eff can also be controlled by adjusting the heat treatment temperature and time here. FIG. 10 shows the results of SIMS evaluations made on the Al distribution in the NiSi electrode before and after the heat treatment. The SIMS analysis was carried out from the surface of the gate electrode toward the substrate. Therefore, the Al distribution in regions deeper than the interface between the gate electrode and the insulating film is strongly affected by the knock-on during the SIMS analysis, and differs from the actual profile.

Figure 2:
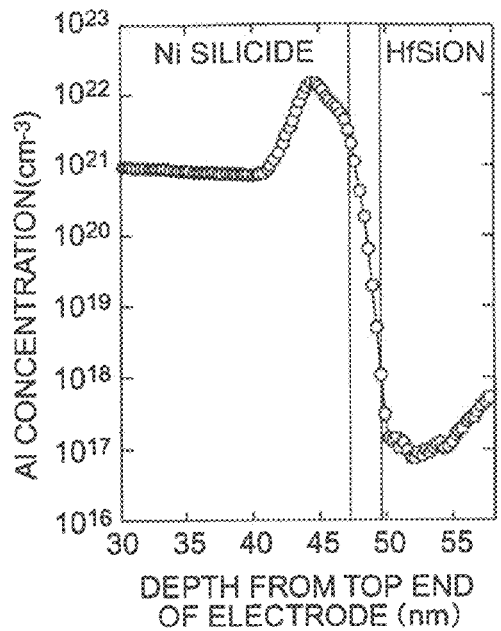
FIG. 2 shows the Al distribution in the depth direction obtained by analyzing the electrode structure of the first embodiment by SIMS.

FIG. 2 shows the results of an analysis carried out by backside SIMS (Secondary Ion Mass Spectroscopy). The SIMS analysis was carried out in the surface direction of the gate electrode 6 in a situation where the Si substrate was removed with a chemical solution so as to expose HfSiON. The primary ions were $O_2^+$ ions. To analyze the diffusion behavior of Al in HfSiON in this analysis, a thick HfSiON film having a physical film thickness of 10 nm was used. As can be seen from FIG. 2, the Al concentration becomes higher at the interface with the silicide layer 6b, and Al is segregated at the interface. Also, the Al ingress into the gate insulating film 5 was restricted to 2 nm or less, and Al diffusion was not caused deep inside the gate insulating film 5 and in the Si substrate. Since the SIMS analysis shown in FIG. 2 was carried out from the substrate side toward the gate electrode surface, knock-on had little influence on the analysis results, and the actual Al distribution in the depth direction was measured. Through the above described heat treatment, the Al layer 6a was formed at the interface between the Ni silicide electrode 6b and the silicon oxide film 5. As can be seen from FIG. 10, an Al layer or a region having Al at high concentration was formed in the vicinity of the electrode surface.

Figure 19:
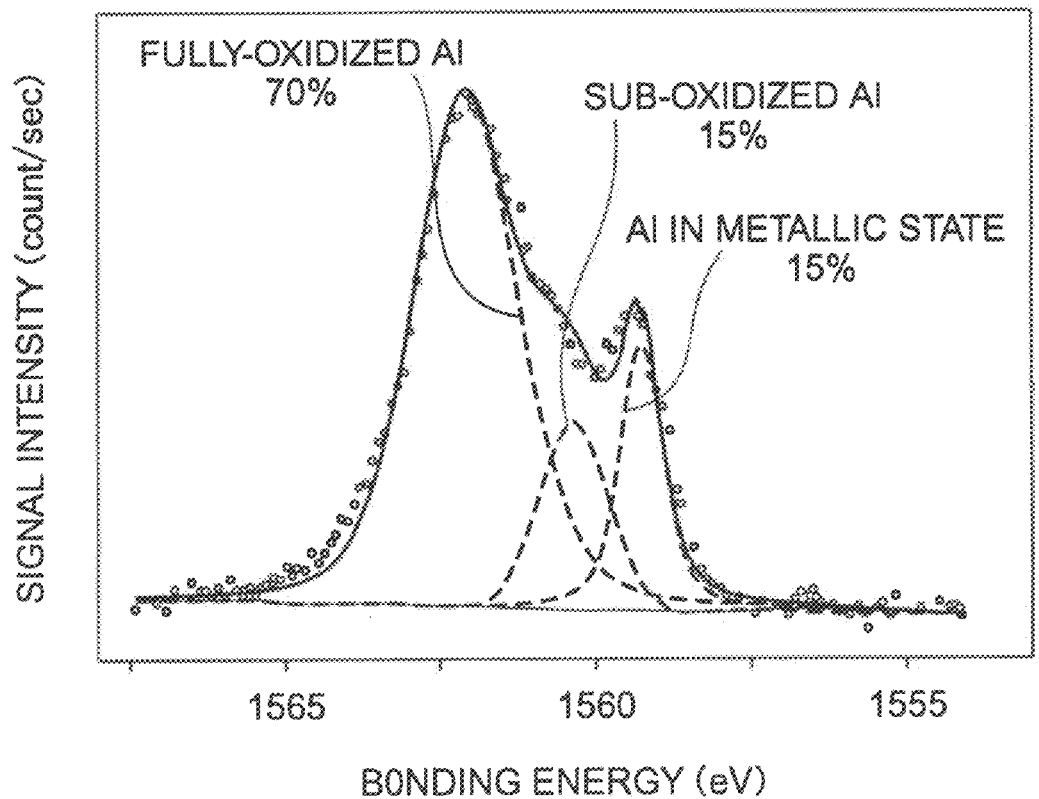
FIG. 19 shows the Al bonded state observed by analyzing the electrode structure of the first embodiment by HX-PES.

FIG. 19 shows the bonding state of the Al layer of this embodiment observed by analyzing the s1 orbital of Al by hard X-ray photoelectron spectroscopy (HX-PES) of SPring-8 radiation facility. In this analysis, the gate electrode thickness was reduced to approximately 10 nm by Ar ion etching, and hard X-rays were emitted in the surface direction of the gate electrode. The photoelectron detection angle used in the analysis was 80°. Al in a metallic state and Al sub oxide is the Al that depends on the NiSi film at the interface. Fully-oxidized Al is the Al that enters the gate insulating film, and is distributed on the outermost surface of the interface on the electrode side. The fully-oxidized Al does not affect the effective work function $\Phi$eff. The spectrum intensity of the fully-oxidized Al is higher than the others, because the Al exposed through the surface was oxidized at the time of thinning the electrode. The hard X-ray photoelectron spectroscopy is an analysis method that is most sensitive to the surface of each sample, and is strongly affected by the Al oxidized on the outermost surface. Accordingly, the fully-oxidized Al ratio on the actual interface is lower than the value estimated by this analysis method, and the Al entering the insulating film is restricted to an area very close to the interface between the gate electrode and the insulating film, as is apparent from the above described SIMS analysis. The Al that contributes to the work function of the Al electrode is the Al existing at the interface on the electrode side, and is in a metallic state or a sub-oxidized state. As can be seen from the spectrum intensity ratio as a result of this analysis, at least 30% or more of the Al existing at the interface is in a metallic state or a sub-oxidized state.

The location and bonding state of Al distributed at the interface can be analyzed not only by the above described HX-PES but also by an actual device analysis. First, NiSi/HfSiON structure that has Al segregated at the interface is picked up as a TEM (Transmission Electron Microscopy) sample from a completed MOS transistor by a general sample producing technique utilizing the focused ion beam technology. The structure of this sample is observed by cross-section TEM, so as to analyze the interface structure with a spatial resolution of atomic size. Further, based on the absorption spectrum obtained when the TEM electron beam emitted onto a predetermined observation point passes through the sample, the element contained in the predetermined point of the sample and the bonding state of the element can be detected from the spatial resolution of atomic size. This is a regular analysis method called TEM-EELS (Electron Energy Loss Spectroscopy). By this method, the existence of Al in a metallic state or a sub-oxidized state on the NiSi side of the NiSi/HfSiON interface, and the existence of Al in a fully-oxidized state on the HfSiON side of the interface can be clearly detected. As shown in FIG. 19, there is a bonding energy difference of 2 eV to 3 eV between the Al in a metallic state or a sub-oxidized state and the Al in a fully-oxidized state. Accordingly, the Al in a metallic state or a sub-oxidized state can be easily distinguished from the Al in a fully-oxidized state through an analysis using a conventional TEM-EELS device.

FIG. 3 shows the value of the effective work function Φeff of the electrode that was estimated based on the amount of Al segregated at the interface by the above described SIMS and HX-PES analysis methods. As the amount of Al at the interface increases, the value of the effective work function Φeff gradually decreases from 4.85 eV of $Ni_3Si$. According to the estimate, when the areal density becomes $1\times10^{15}$ $cm^{-2}$ or higher, the effective work function Φeff becomes 4.3 eV, which is the characteristic value of the effective work function Φeff of Al. Since the effective work function Φeff is determined by the elemental species existing at the interface with the gate electrode, the effective work function Φeff of the gate electrode approaches to the effective work function Φeff of the Al layer 6a, as the areal density of Al on the surface becomes higher. When the areal density is $1\times10^{15}$ $cm^{-2}$, an Al layer 7 of one monolayer exists on the electrode side of the interface. By making the concentration lower than that, the intermediate value between the effective work functions Φeff of $Ni_3Si$ and Al can be constantly achieved, and the effective work function Φeff varies with the amount of Al in a sub-oxidized state at the interface.

The effective work function Φeff of a gate electrode is determined by the elemental species at the interface. Accordingly, the Al layer existing as a second layer counted from the gate electrode in this embodiment does not affect the effective work function Φeff, and is not required for controlling the effective work function Φeff. However, the specific resistance of Al is lower than that of $Ni_3Si$, and, as the film thickness of the Al layer 6a increases, the sheet resistance of the gate electrode is lowered. Therefore, the Al layer 6a should preferably have a large film thickness. If the film thickness of the Al layer 6a is 10 nm or more, however, the difference in gate height between the n-type transistor and the p-type transistor becomes too large, and hinders the wiring plug formation to be carried out at the same time. Therefore, the thickness of the Al layer 6a needs to be smaller than 10 nm.

Figure 11:
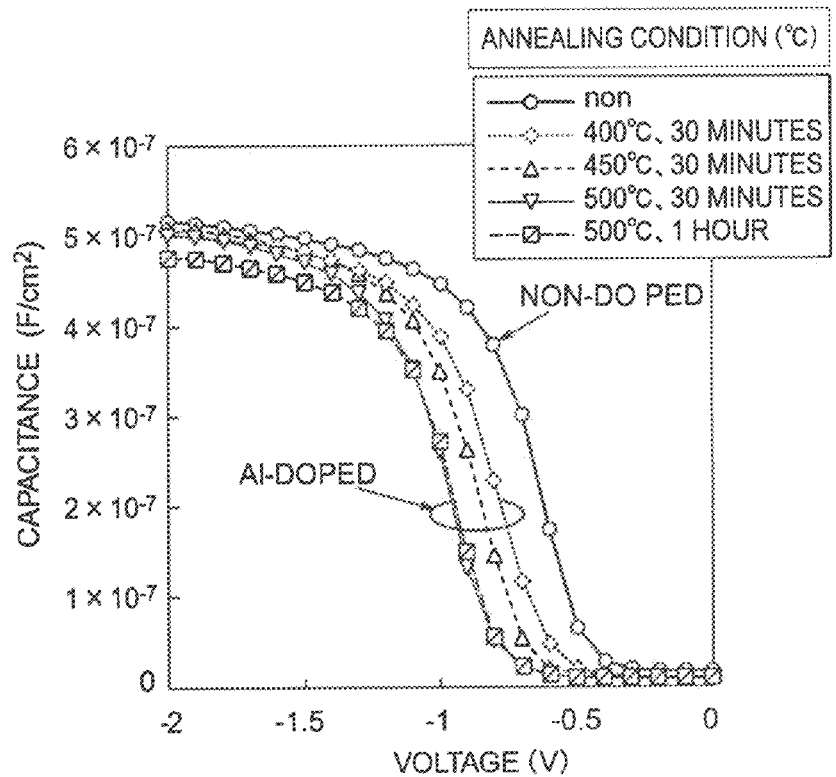
FIG. 11 shows the heat diffusion dependence of the C-V characteristics of the MOS capacitor in accordance with the first embodiment.

FIG. 11 shows the capacitance-voltage (C-V) characteristics of a MIS capacitor formed with a stack structure of NiSi/HfSiON/p-type Si that has Al atoms segregated at the interface between the gate electrode and the gate insulating film. As the heat treatment temperature for segregating Al at the interface becomes higher, or as the heat treatment time becomes longer, the areal density and the film thickness of the Al layer increase, and the C-V curve shifts in the negative voltage direction. As the work function decreases, the flat band voltage drops. In a case of a thermal budget of 500° C. for 30 minutes or more, the effective work function Φeff is constant at 4.3 eV. In this case, the Al layer is apparently one monolayer or more.

The heat treatment also depends on the heat treatment time, and should preferably be carried out for a period of time ranging from 10 seconds to one hour. If the heat treatment is continued over an hour, the production costs increase in view of productivity. If the heat treatment is carried out for less than 10 seconds, some devices do not have Al diffused at the interfaces.

The atmosphere to be used during the heat treatment is preferably a nitrogen atmosphere. The temperature range should be 300° C. to 600° C. If the temperature is lower than 300° C., the Al diffusion speed becomes low, and increases the production costs. If the temperature is higher than 600° C., which is close to the melting point of Al, the Al layer damages the gate insulating film, and reduces the reliability of the device. The resist or the hard mask in the p-channel transistor formation region is removed, so as to obtain the structure of the first embodiment shown in FIG. 1.

In this process, the silicide formation procedure is carried out only once to produce the gate electrodes. Accordingly, the production time can be made shorter and the production costs can be made lower than in a case where silicide procedures using different metal elements according to the conductivity types are carried out as disclosed in Documents 1 and 2.

The addition of Al may be carried out not only through ion implantation after the formation of the silicide gate electrodes, but also through heat diffusion of the Al layer 6a formed only on the silicide electrode of the n-channel MIS transistor. Alternatively, Al may be added through a silicide reaction with a Ni film containing Al. In either case, the procedure for removing the metal film of the p-channel MIS transistor is necessary, which complicates the production process. In the latter case, a Ni film containing Al needs to be deposited in the n-channel MIS transistor, and a Ni film needs to be deposited in the p-channel MIS transistor. This also increases the number of procedures and complicates the production process. In the former case, however, the silicides of the n-channel MIS transistor and the p-channel MIS transistor can be identical, and accordingly, the production time can be advantageously shortened, as will be described in the following embodiments. It is also possible to pre-dope polycrystalline Si with Al before the formation of the silicide gate electrodes. In this case, however, there is a large difference in silicide reaction speed between different kinds of impurities added. This results in a narrow process margin and lower production yield.

In a manufacturing method using $Ni_3Si$ in accordance with this embodiment, when the electrodes 6b and 16 made of $Ni_3Si$ are formed, a Ti thin-film layer may be inserted at the interface between Ni and polycrystalline Si, so as to improve the selectivity of acid wet etching resistance of the gate electrodes and the unreacted Ni. A process and a structure for achieving such effects can be effectively employed. A $Ni_3Si$ phase has a low selective etching ratio with respect to the unreacted Ni. Accordingly, the margins of conditions such as the etching temperature and time of each Ni layer become smaller than in a case of conventional salicide NiSi. Therefore, a Ti layer is formed before the Ni film formation, and a heat treatment for silicide formation is then carried out in the same manner as above. Since the diffusion speed of Ni is high, the positions of Ni and Ti are reversed, and a $TiSi_2$ phase 32 is formed on the upper layer of each $Ni_3Si$ electrode. The $TiSi_2$ phase 32 has a high resistance to the above described mixed solution of sulfuric acid ($H_2SO_4$) and a hydrogen peroxide solution ($H_2O_2$). Accordingly, the $TiSi_2$ phase 32 serves as a $Ni_3Si$ gate electrode protection layer during the Ni selective removal. Thus, the structure of this embodiment can be readily formed.

Figure 12:
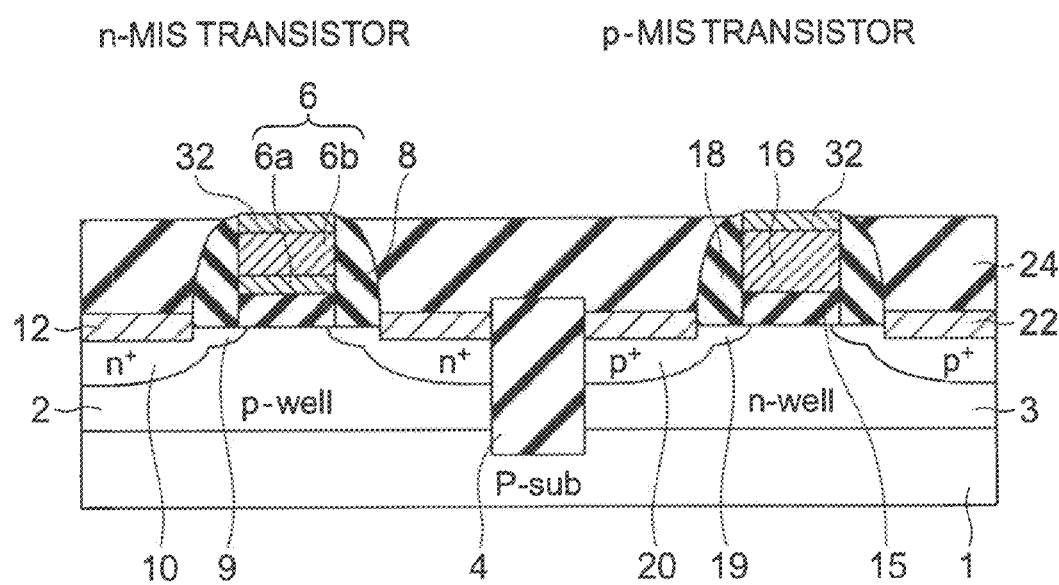
FIG. 12 is a cross-sectional view of a CMISFET in accordance with a fourth modification of the first embodiment.

In the device produced in this manner, the Ti silicide phases 32 are formed on the gate electrodes 6 and 16 in the transistors of both conductivity types having the structure of the first embodiment, as shown in FIG. 12. The interfaces between the gate electrodes and the insulating films in the structure shown in FIG. 12 have the same structures as those of the first embodiment, and accordingly, have the same effects as those of the first embodiment. Still, the structure shown in FIG. 12 can be produced more easily.

The same structure as above can be obtained by forming a Ti layer on each Ni film, not at the interface, at the time of Ni film formation. However, the natural oxide film layer on the surface of polycrystalline silicon can be reduced by inserting Ti having high reducibility at the interface. By doing so, defects such as incomplete silicides can be prevented. Therefore, it is preferable to insert Ti at the interface.

As described above, in accordance with this embodiment and its modifications, a semiconductor device that generates less leakage current and has an appropriate threshold value, and a method for manufacturing such a semiconductor device, can be provided.

Second Embodiment

Figure 13:
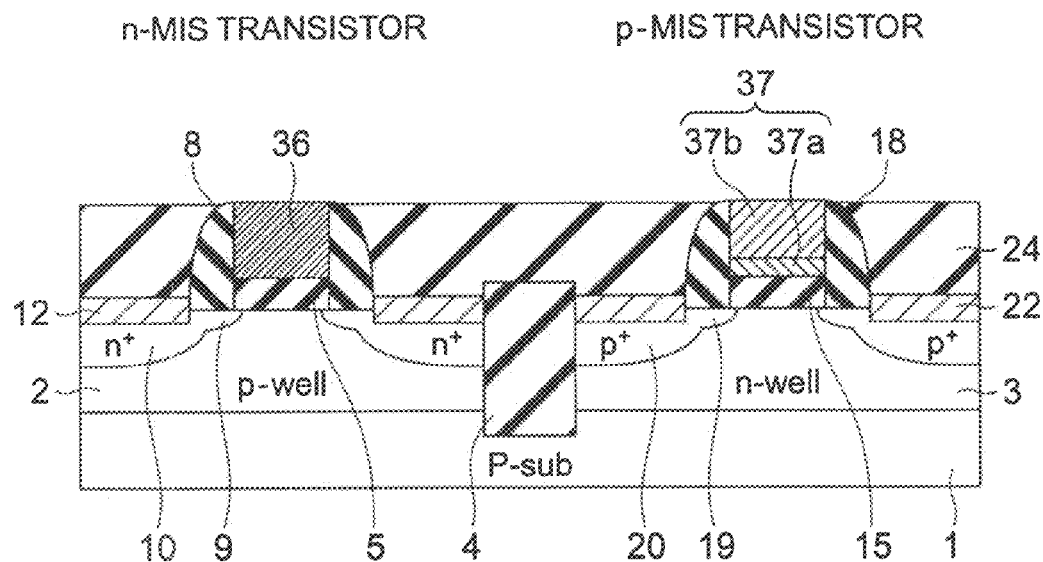
FIG. 13 is a cross-sectional view of a CMISFET in accordance with a second embodiment.

Referring now to FIG. 13, a semiconductor device in accordance with a second embodiment of the present invention is described. The semiconductor device of this embodiment is a CMISFET, and a cross-section of the CMISFET taken in the gate length direction is shown in FIG. 13.

The CMISFET of this embodiment differs from the CMISFET of the first embodiment of FIG. 1 in that the gate electrode of the n-channel MIS transistor having the stack structure of the Al layer 6a and the Ni silicide layer 6b is replaced with a single-layer Hf silicide layer 36, and the Ni silicide layer 16 as the gate electrode of the p-channel MIS transistor is replaced with a gate electrode 37 having a stack structure formed with a gold (Au) layer 37a as a lower layer and a Hf silicide layer 37b as an upper layer. The Hf silicide layer 36 and the Hf silicide layer 37b have the same $HfSi_2$ compositions.

Like the first embodiment, this embodiment provides gate electrodes having different effective work functions $\Phi$eff from each other, so as to optimize the threshold voltages according to the conductivity types. The gate electrode in the n-channel MIS transistor of this embodiment is the $HfSi_2$ layer 36, and the effective work function $\Phi$eff of the $HfSi_2$ layer 36 is 4.35 eV. Accordingly, a low threshold voltage can be achieved. Also, the layer of the gate electrode 37 in contact with the gate insulating film 15 of the p-channel MIS transistor is the Au layer 37a having a thickness of one monolayer. The effective work function $\Phi$eff of the Au layer 37a is 5.05 eV, which is suitable for achieving a low threshold voltage in the p-channel MIS transistor.

Figure 14:
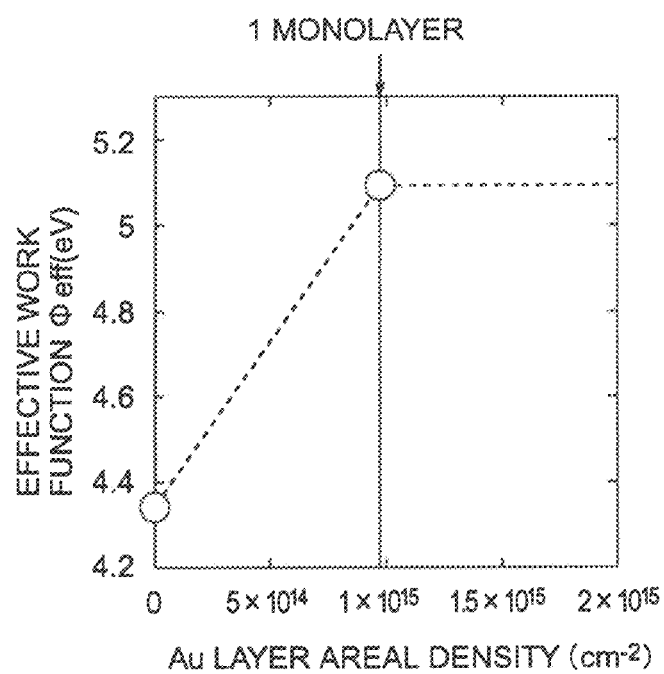
FIG. 14 shows the relationship between the effective work function of the gate electrode and the film thickness of the Au layer in accordance with the second embodiment.

In this embodiment, the effective work function $\Phi$eff of the gate electrode 37 varies with the areal density or film thickness of the Au layer 37a. FIG. 14 shows the relationship between the value of the effective work function $\Phi$eff of the electrode 37 and the Au amount at the interface. As can be seen from FIG. 14, as the Au amount at the interface increases, the value of the effective work function $\Phi$eff constantly increases from 4.35 eV, which is the value of the effective work function of Hf silicide ($HfSi_2$). When the Au amount becomes one monolayer or larger, the effective work function $\Phi$eff of the electrode 37 becomes 5.05 eV, which is the value of the effective work function $\Phi$eff of Au. The concentration is made lower than that, so that an intermediate value between the effective work functions $\Phi$eff of Hf silicide ($HfSi_2$) and Au can be constantly obtained. Since the Au layer 37a of this embodiment is not very reducible, the Au layer 37a does not reduces the gate insulating film 15 and flow into the gate insulating film 15. However, the diffusion speed of Au running along crystal grain boundaries is high. Therefore, the gate insulating film 15 needs to have an amorphous structure or an epitaxial structure, as in the first embodiment.

The effective work function $\Phi$eff of an electrode is determined by the elemental species at the interface. Accordingly, the Au layer 37a existing as a second layer counted from the electrode in this embodiment does not affect the effective work function $\Phi$eff of the electrode, and is not required for controlling the effective work function $\Phi$eff. However, the specific resistance of Au is lower than that of $HfSi_2$ of the electrode 37b, and, as the film thickness of the Au layer 37a increases, the sheet resistance of the gate electrode is lowered. Therefore, the Au layer 37a should preferably have a large film thickness. If the film thickness of the Au layer 37a is 10 nm or more, however, the difference in gate height between the n-type transistor and the p-type transistor becomes too large, and hinders the wiring plug formation to be carried out at the same time. Therefore, the thickness of the Au layer 37a needs to be smaller than 10 nm.

If a high threshold voltage is required for the device, a material having a larger effective work function $\Phi$eff than $HfSi_2$ used in the silicide layer of the gate electrode of this embodiment, such as a $TaSi_2$ crystalline phase, is used for the gate electrode 36 of the n-channel MIS transistor. The areal density or film thickness of the Au layer 37a of the p-channel MIS transistor is adjusted to a film thickness of one monolayer or smaller, which is suitable for achieving a desired effective work function $\Phi$eff in the p-channel MIS transistor. The effective work function $\Phi$eff of $TaSi_2$ is 4.4 eV. In a case where a material other than $HfSi_2$ is used for the silicide layer 37b as the upper layer of the electrode 37, the effective work function $\Phi$eff also becomes the largest where the Au layer 37a has a film thickness of one monolayer or more. If the Au areal density is smaller than one monolayer, however, the relationship between the effective work function $\Phi$eff and the Au amount varies with the value of the effective work function $\Phi$eff of the silicide layer as the upper layer in the p-channel MIS transistor. The film thickness of the Au layer 37a may be readily controlled by reducing the amount of ion implantation, as in the case of Al.

Although $NfSi_2$ phases as silicide materials are used for the gate electrodes 36 and 37b in this embodiment, any other compound of a metal having a larger effective work function $\Phi$eff than the mid gap of Si and a IV-group semiconductor, such as a silicide material, a germanide material, or a carbide material, may be employed. Alternatively, mixed crystals of those materials may be employed. Those materials have excellent compatibility with the existing transistor manufacturing processes, for the same reasons as those described for the case of Al. Specific examples of materials other than the above include $Ta_2Si$, $TiSi_2$, $ZrSi_2$, $HfSi_2$, $WSi_2$, $Er_3Si_5$, containing Ta, Ti, Zr, Hf, W, or Er. To obtain a low electrical resistivity required for gate electrodes, $Ta_2Si$ and $TiSi_2$ are particularly preferred. To obtain higher heat resistance, nitrogen may be added to each gate electrode. With the addition of nitrogen, crystallization in each gate electrode is restrained, while the crystal grains become relatively small with respect to the gate length. Accordingly, the variations of the threshold values of transistors due to the work function difference caused by the crystal faces can be restrained.

To achieve a low threshold voltage in an n-type transistor in a case where the gate insulating film contains Hf, the metal composition ratio in the gate electrode is preferably higher than the silicon or germanium composition ratio, as already mentioned in First Embodiment.

Having a high melting point, a carbide material does not cause an increase in leakage current or degradation of reliability even if it is formed on the gate insulating film during the high-temperature procedure. Accordingly, a carbide material can be formed through the same manufacturing procedures as those for a conventional polycrystalline silicon gate electrode.

Figure 15:
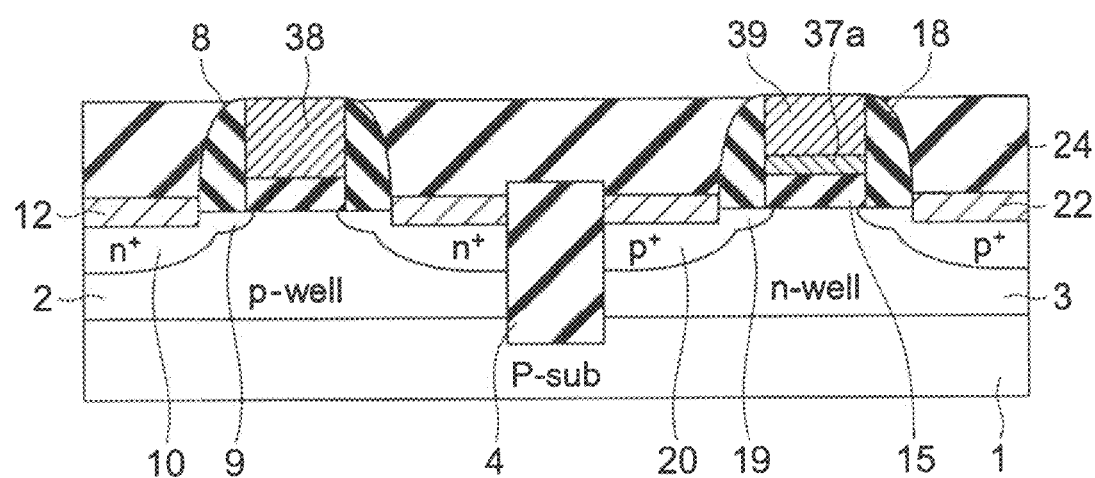
FIG. 15 is a cross-sectional view of a CMISFET in accordance with a modification of the second embodiment.

FIG. 15 shows a CMISFET in accordance with a modification of this embodiment. The CMISFET of this modification differs from the CMISFET of the second embodiment of FIG. 13 in that the gate electrode 36 made of HfSi$_2$ of the n-channel MIS transistor and the HfSi$_2$ layer 37b as the upper layer of the gate electrode 37 of the p-channel MIS transistor are replaced with TaC layers 38 and 39, respectively. The effective work function Φeff of TaC is 4.25 eV, which is even lower than the effective work function Φeff of TaSi$_2$. Accordingly, the threshold voltage of the n-channel MIS transistor is further lowered. Preferred examples of metals to be contained in the carbide are Ta, Ti, Hf, Zr, Mo, and W. However, the effective work function Φeff of the carbide needs to be made smaller than the mid gap of Si by controlling the composition of a metal and carbon and the crystalline orientation. In this modification, the impurities are effectively segregated at the interfaces with both gate electrodes, so as to secondarily adjust the effective work function Φeff.

As in the second and third modifications of the first embodiment shown in FIGS. 5 and 6, it is also possible to provide an Au layer at the interfaces between the source/drain diffusion layers and the silicide layers above them. In such a case, however, an Au layer is provided only in the p-channel MIS transistor formation region. Here, the Schottky barrier height for hole is reduced, and the contact resistance is lowered, regardless of the structure of the source and drain. Thus, transistor operation can be performed at a higher speed.

(Manufacturing Method: Au Ion Implantation)

Figure 16:
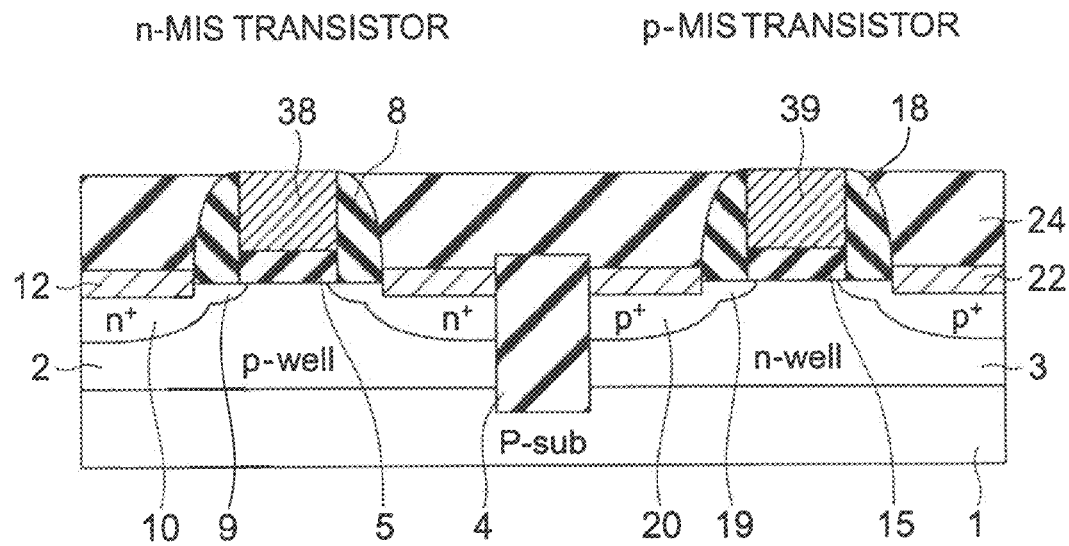
FIGS. 16 to 17 are cross-sectional views showing a procedure for manufacturing the CMISFET in accordance with the modification of the second embodiment.
Figure 17:
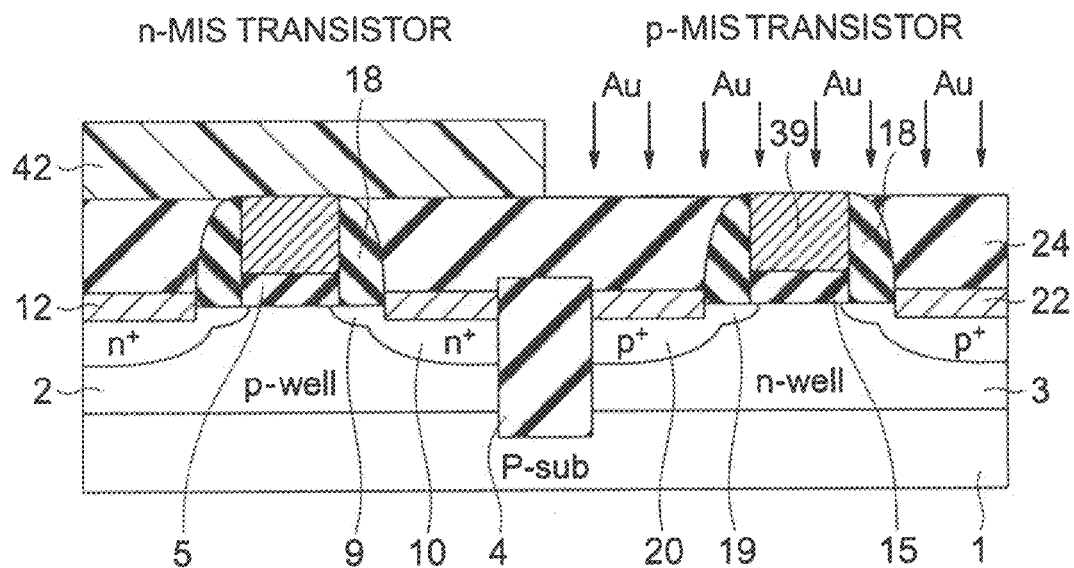

Referring now to FIGS. 16 and 17, a method for manufacturing the semiconductor device in accordance with the modification of the second embodiment shown in FIG. 15 is described.

The same procedures as the procedures in accordance with the first embodiment shown in FIGS. 7 through 9 are carried out, so as to form HfSiOn films to be used as the gate insulating films 5 and 15 on the silicon substrate 1 (see FIG. 16).

After that, a 50-nm thick TaC layer to be used as the gate electrodes of the n-channel MIS transistor and the p-channel MIS transistor is deposited by low-pressure CVD, and a 30-nm thick SiN layer (not shown) is deposited thereon. Patterning is then performed on the SiN layer by a lithography technique. With the patterned SiN layer serving as a mask, anisotropic etching is performed so as to form the TaC layers 38 and 39 shaped as the gate electrodes (see FIG. 16).

Next, the extension layers 9 and 19 are formed through phosphorus and boron ion implantation, and the sidewalls 8 and 18 for insulating the gate electrodes from the source/drain regions are formed (see FIG. 16). Phosphorus and boron ion implantation is then performed with a higher acceleration voltage than the acceleration voltage for the formation of the extension layers 9 and 19, so as to form the diffusion layers 10 and 20 (see FIG. 16). The extension layers 9 and 19 and the diffusion layers 10 and 20 constitute the source/drain regions. A 8-nm thick Ni film is then formed by sputtering, and a heat treatment is carried out at 400° C., so as to form the NiSi contact layers 12 and 22 over the source/drain regions. Selective etching is then performed on the unreacted Ni in the other regions with a H$_2$SO$_4$ solution, so as to selectively form the NiSi layers 12 and 22 only on the source/drain regions (see FIG. 16).

The SiN layers on the gate electrodes are then removed, and a silicon oxide film to be the interlayer insulating film 24 is deposited by low-pressure CVD. The top ends of the gate electrodes are then exposed by CMP (see FIG. 16).

Next, only the p-channel MIS transistor formation region is exposed by a lithography technique, while the n-channel MIS transistor formation region is covered with a resist or a hard mask 42 (see FIG. 17). Au ion implantation is then performed so as to add Au to the gate electrode 39 of the p-channel MIS transistor. The Au dose amount is 1×10$^{16}$ cm$^{-2}$, and the acceleration voltage is 60 keV. As mentioned in Second Embodiment, the dose amount is adjusted to the optimum amount, so that the Au layer 37a has a necessary film thickness and areal density required for a desired effective work function Φeff. The acceleration energy should be so low that Au ions cannot reach the gate insulating film 15. Typically, the mean Au ion range needs to be within ⅔ of the height of the gate electrode from the upper surface thereof. A heat treatment is then carried out at 500° C. for one hour, so as to segregate Au ions at the interface between the gate electrode 39 and the gate insulating film 15 and form the Au layer 37a. Here, like the Au additive amount, the effective work function Φeff can be controlled by adjusting the heat treatment temperature and time. During the high-temperature heat treatment, Au does not form a compound with carbon, silicon, or germanium. As a result, the Au layer 37a is precipitated at the interface between the gate electrode 39 and the insulating film 15.

The heat treatment also depends on the heat treatment temperature, but should preferably be carried out for a period of time ranging from 10 seconds to one hour. If the heat treatment is continued over an hour, the production costs increase in view of productivity. If the heat treatment is carried out for less than 10 seconds, some devices do not have Au ions diffused at the interfaces, and variations of devices become wider.

The atmosphere to be used during the heat treatment is preferably a nitrogen atmosphere. The temperature range should be 300° C. to 600° C. If the temperature is lower than 300° C., the Au diffusion speed becomes low, and increases the production costs. If the temperature is higher than 600° C., which is close to the melting point of Au, the Au layer 37a damages the gate insulating film 15, and reduces the reliability of the device. The resist or the hard mask 42 in the p-channel MIS transistor formation region is removed, so as to obtain the structure of this modification shown in FIG. 15.

As described above, in accordance with this embodiment and its modification, a semiconductor device that generates less leakage current and has an appropriate threshold value, and a method for manufacturing such a semiconductor device, can be provided.

Third Embodiment

Figure 18:
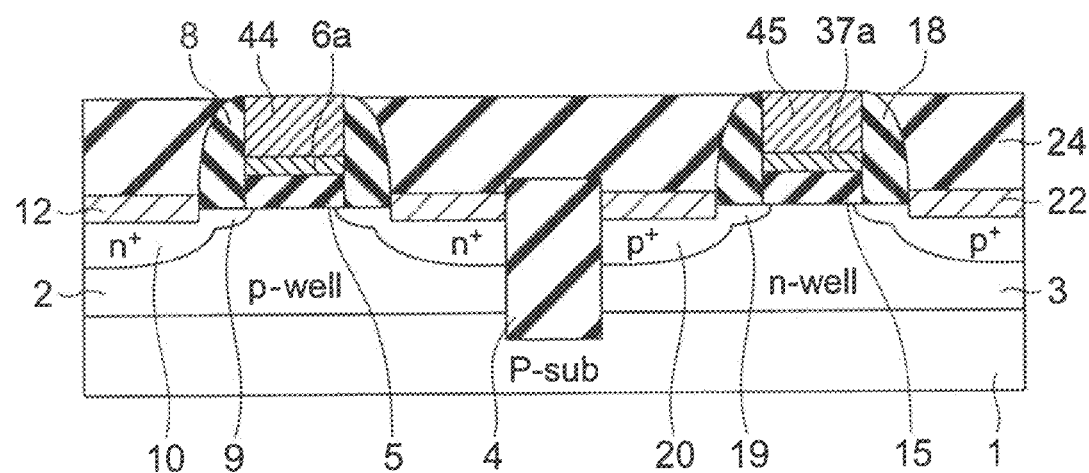
FIG. 18 is a cross-sectional view of a CMISFET in accordance with a third embodiment.

Next, a semiconductor device in accordance with a third embodiment of the present invention is described. The semiconductor device of this embodiment is a CMISFET, and a cross-section of the CMISFET taken in the gate length direction is shown in FIG. 18.

The CMISFET of this embodiment differs from the CMISFET of the first embodiment of FIG. 1 in the gate electrodes of the n-channel MIS transistor and the p-channel MIS transistor. In this embodiment, the gate electrode of the n-channel MIS transistor has a stack structure that is formed with an Al layer 6a as the lower layer and a NiSi layer 44 as the upper layer. The gate electrode of the p-channel MIS transistor also has a stack structure that is formed with an Au layer 37a as the lower layer and a NiSi layer 45 as the upper layer. Each of the lower layers 6a and 37a has a film thickness of one monolayer. The NiSi layer 44 and the NiSi layer 45 also have the same film thicknesses.

As in the first embodiment, the gate electrodes in this embodiment also have different effective work functions Φeff from each other, so as to optimize the threshold voltages according to the conductivity types. The gate electrodes in contact with the gate insulating films 5 and 15 are the Al layer 6a in the n-type MIS transistor and the Au layer 37a in the p-type MIS transistor, respectively. The effective work functions Φeff of the gate electrodes are 4.3 eV and 5.05 eV, each of which is suitable for achieving a low threshold voltage.

As in the first and second embodiments, the areal density of each of the Al layer 6a and the Au layer 37a is made as small as one monolayer or less, so that the effective work functions Φeff of the Al layer 6a and the Au layer 37a become closer to the effective work function Φeff of NiSi, which is 4.65 eV. Accordingly, the values of the work functions Φeff can be constantly controlled by adjusting the surface densities of the Al layer 6a and the Au layer 37a. The effects of the gate electrode as a lower layer are the same as those of the Al layer 6a of the first embodiment and those of the Au layer 37a of the second embodiment. Also, NiSi having a low resistivity is employed in this embodiment, so as to reduce the sheet resistance of the gate electrodes. NiSi is a material used as the contact material for the source/drain regions or the upper low-resistance layer of a gate electrode in the existing devices. Accordingly, the costs for developing and manufacturing the structure of this embodiment can be made lower.

Since the upper layer of each of the gate electrodes of both conductivity types does not contribute to the effective work function Φeff, a metal material having the lowest possible resistance for the manufacturing process is preferably used as the upper layer.

The semiconductor device of this embodiment is manufactured by performing the Al ion implantation described in First Embodiment and the Au ion implantation described in Second Embodiment.

As described above, in accordance with this embodiment, a semiconductor device that generates less leakage current and has an appropriate threshold value, and a method for manufacturing such a semiconductor device, can be provided.

Fourth Embodiment

Next, a method for manufacturing a semiconductor device in accordance with a fourth embodiment of the present invention is described. By the manufacturing method of this embodiment, $Ni_2Si$ is used for the gate electrodes of the n-channel MIS transistor and the p-channel MIS transistor, and the heat diffusion from an Al thin film formed on the $Ni_2Si$ film is utilized to introduce Al into the gate electrode of the n-channel MIS transistor. By the manufacturing method of this embodiment, NiSi may be used, instead of $Ni_2Si$, for the gate electrodes. The solid state properties of $Ni_2Si$ and NiSi are very similar, and have substantially the same advantages over $Ni_3Si$, as will be described later. However, the work function of $Ni_2Si$ is larger than the work function of NiSi, and is more suitable for the gate electrode of the p-channel MIS transistor. Therefore, it is more preferable to use $Ni_2Si$ in this embodiment.

Since $Ni_2Si$ has a lower specific resistance than $Ni_3Si$, the parasitic resistance of the resultant transistor is relatively low, which contributes to an increase in transistor operation speed. Also, since $Ni_2Si$ has a lower volume expansion rate than $Ni_3Si$ at the time of silicide formation, the probability of defects such as breaking of the gate electrodes during the transistor manufacturing process can be made lower. Furthermore, $Ni_2Si$ has a higher resistance against etching by a chemical solution than $Ni_3Si$, and can solve the above mentioned problem of a decrease in etching selectivity at the time of unreacted Ni removal. In addition to that, $Ni_2Si$ can diffuse Al at a higher speed than $Ni_3Si$ in the procedure for thermally diffusing Al. This will be described later in detail, with reference to the specific results of experiments. By virtue of the above described properties, $Ni_2Si$ can cause Al atoms to reach the interface between the silicide and the insulating film with higher efficiency, and can reduce the Al diffusion source above the silicide. Also, $Ni_2Si$ can complete the Al segregation at the interface with a lower thermal budget than $Ni_3Si$. Since the Al interface segregation is carried out as a post processing of the transistor manufacturing, a lower thermal budget helps to maintain the impurity profiles in the transistor and does not adversely affect the parasitic resistance or the short-channel effect.

Figure 20:
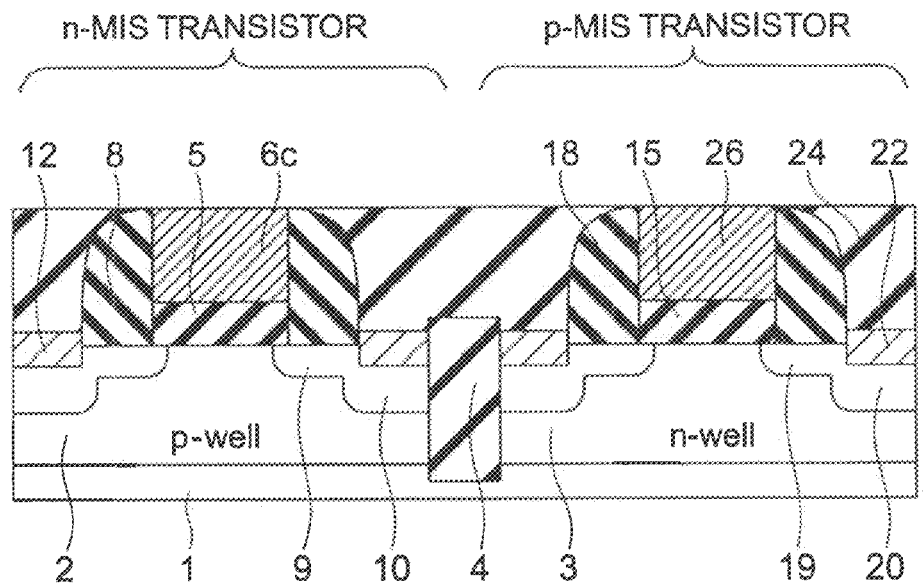
FIGS. 20 to 21 are cross-sectional views showing a manufacturing procedure by a manufacturing method in accordance with a fourth embodiment.
Figure 21:
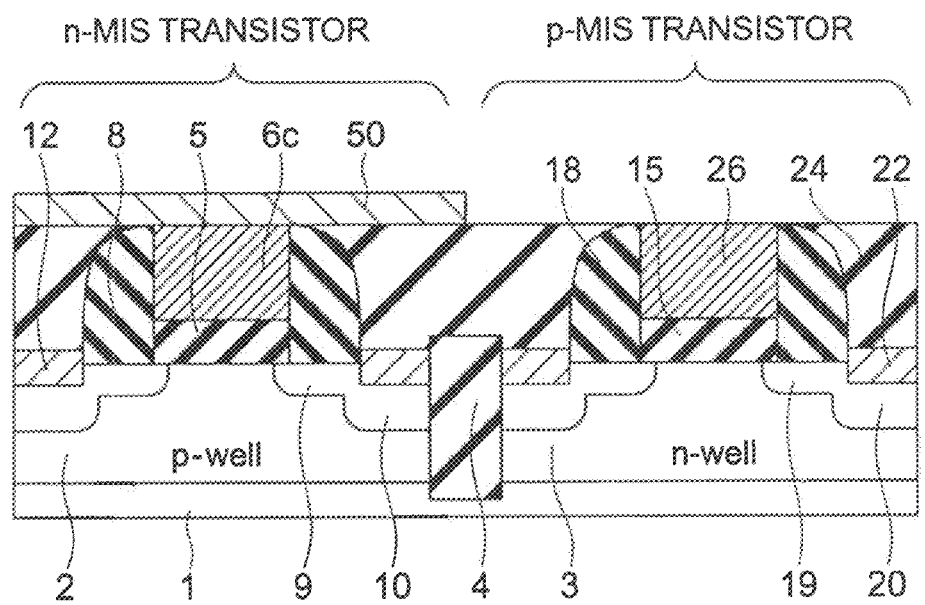
Figure 22:
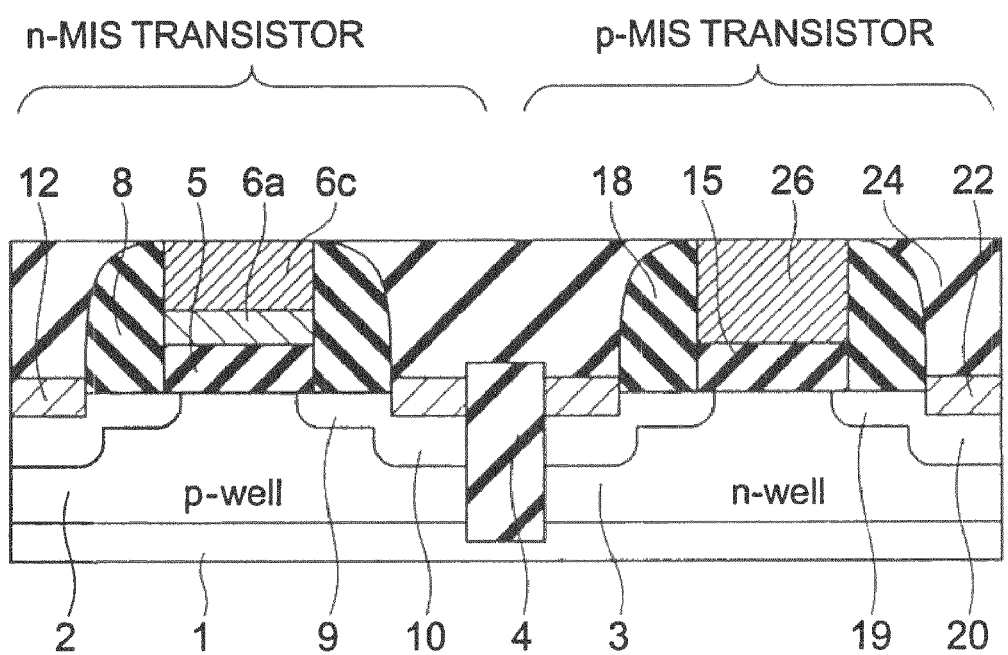
FIG. 22 is a cross-sectional view of a CMISFET manufacturing by the manufacturing method in accordance with the fourth embodiment.

Referring now to FIGS. 20 through 22, the manufacturing method in accordance with this embodiment is described.

After the device isolation layer 4 is formed in the silicon substrate 1, the p-type well region 2 and the n-type well region 3 are formed through ion implantation (see FIG. 20). The device isolation layer 4 may be formed by local oxidation or the shallow trench method (STI), and may have a mesa shape.

Next, the HfSiON films 5 and 15 to be used as the gate insulating films are formed on the surface of the silicon substrate 1 by MOCVD. In a case where high-dielectric (high-k) films are to be formed, a film forming method other than MOCVD, such as ALD, may be used, and Si or N may be added to the HfO films as in the case of HfSiON (see FIG. 7). Other than HfSiON, an insulating material such as HfAlO, HfAlON, ZrSiON, or HfON may be used.

A 50-nm thick polycrystalline silicon layer to be used as the gate electrodes is deposited, and a 10-nm thick SiN cap layer (not shown) is deposited on the polycrystalline silicon layer by low-pressure CVD. Patterning is then performed by a lithography technique, and anisotropic etching such as reactive ion etching is performed so as to adjust the shapes of the gate electrodes.

Phosphorus and boron ions are then implanted into the p-type well region 2 and the n-type well region 3, so as to form the shallow n-type extension layers 9 and the shallow p-type extension layers 19 having high impurity concentrations (see FIG. 20). To form the extension layers 9 and 19, an elevated source/drain structure that can restrain a short-channel effect as the device characteristics can be formed by the selective epitaxial growth method. When such an elevated source/drain structure is formed, impurities may be introduced at the same time.

Next, the sidewalls 8 and 18 are formed on the sides of the gate electrodes (see FIG. 20). Phosphorus and boron ions are then implanted into the p-type well region 2 and the n-type well region 3 with a higher acceleration voltage than the acceleration voltage for the formation of the extension layers 9 and 19, so as to form the deep n-type diffusion layers 10 and the deep p-type diffusion layers 20. The n-type diffusion layers and the n-type extension layers 9 form the n-type source/drain regions, while the p-type diffusion layers 20 and the p-type extension layers 19 form the p-type source/drain regions.

A 8-nm thick Ni film is formed by sputtering, and a heat treatment is carried out at 400° C., so as to form the NiSi contact layers 12 and 22 over the source/drain regions 10 and 20 (see FIG. 20). Selective etching is then performed on the unreacted Ni in the other regions with a $H_2SO_4$ solution, so as to selectively form NiSi only on the source/drain regions 10 and 20.

The cap layers made of SiN on the gate electrodes are then removed, and a silicon oxide film to be the interlayer insulating film 24 is deposited by low-pressure CVD. The top ends of the gate electrodes are then exposed by CMP (see FIG. 20).

A 50-nm thick Ni film is then formed by sputtering, and a low-temperature heat treatment is carried out at 500° C., so as to form silicide layers in the interface regions between the Ni and the polycrystalline Si. In this manner, gate electrodes 6c and 26 of $Ni_2Si$ phases are formed for the n-channel MIS transistor and the p-channel MIS transistor, respectively (see FIG. 20). The heat treatment for the silicide formation is preferably carried out in two stages, and wet etching for removing the unreacted Ni is performed between the two stages. In this manner, excess Ni existing on the gate sidewalls is prevented from flowing into the gate electrodes, and silicide layers of the same Ni—Si compositions can be formed simultaneously in the transistors having different gate lengths. As a result, variations in threshold voltage can be restrained. In this case, the heat treatment in the first stage is preferably carried out at temperatures ranging from 300° C. to 450° C. for one minute. If the heat treatment in the first stage is carried out at a temperature of 500° C. or higher, the excess Ni flows into the gate electrodes as described above. The heat treatment in the second stage needs to be carried out at temperatures ranging from 400° C. to 600° C. If the temperature is higher than 600° C., the gate electrodes are broken due to aggregation of the Ni silicide film. As a result, the electric resistance of the gate electrodes is increased, and an erroneous transistor operation is caused.

Next, only the n-channel MIS transistor formation region is exposed by a lithography technique, as shown in FIG. 21. Meanwhile, the p-channel MIS transistor formation region is covered with a resist or a hard mask (not shown). An Al thin film 50 is then formed only on the gate electrode 6c of the n-channel MIS transistor by sputtering or the like. In this embodiment, the film thickness of the Al thin film 50 is 30 nm.

At this point, the film thickness of the Al thin film 50 is preferably 1 nm or larger. If the Al thin film 50 is thinner than 1 nm, a sufficient amount of Al cannot be eccentrically distributed at the interface with the insulating film. To segregate Al at the interface, there is not an upper limit on the film thickness of the Al thin film 50. However, when Al is thermally diffused in a later procedure, the morphology of the $Ni_2Si$ film might deteriorate if the Al thin film is thick. Therefore, the film thickness of the Al thin film 50 is preferably 50 nm or smaller, and more preferably, 30 nm or smaller.

The Al thin film 50 may be formed by a method other than sputtering, such as CVD. However, sputtering is the most desirable. This is because various impurity elements contained in the material gas used by CVD, such as oxygen, enter the Al thin film, and greatly hinder the Al diffusion into the Ni silicide, resulting in lower efficiency in Al segregation at the interface with the gate insulating film. By a sputtering technique, the impurity concentration in the Al thin film can be made lower than by the CVD. Accordingly, a sputtering technique is more desirable in this embodiment.

A heat treatment is then carried out at 450° C. for 30 minutes, so as to segregate Al at the interface between the gate electrode 6c and the gate insulating film 5 and form the Al layer 6a. With the use of an etching solution such as a mixed solution of sulfuric acid and a hydrogen peroxide solution, the Al thin film 50 is selectively removed with respect to the $Ni_2Si$ film. Here, a mixed solution of phosphoric acid, acetic acid, and hydrochloric acid may be used as the etching solution. Through this process, the semiconductor device having the structure shown in FIG. 22 is completed.

Figure 23:
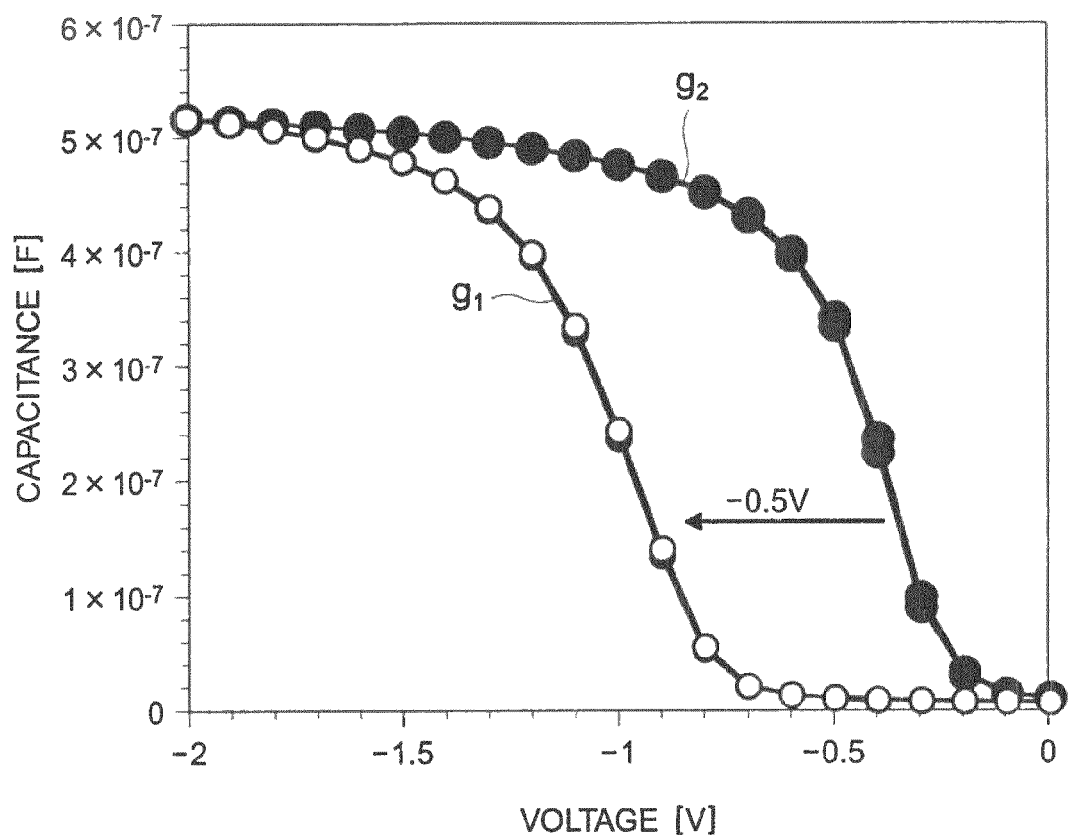
FIG. 23 shows the capacitance-voltage characteristics of a MIS capacitor manufactured by the manufacturing method in accordance with the fourth embodiment.

In FIG. 23, a graph $g_1$ shows the capacitance-voltage (C-V) characteristics of a MIS capacitor that is formed by depositing an Al thin film on a $Ni_2Si$ film of a stack structure of $Ni_2Si$/HfSiON/p-type Si, and carrying out a heat treatment at 450° C. for 30 minutes as in the manufacturing method of this embodiment. This MIS capacitor has Al segregated at the interface between a $Ni_2Si$ film and a HfSiON film.

As a comparative example, a graph $g_2$ in FIG. 23 shows the capacitance-voltage characteristics of a MIS capacitor formed with $Ni_2Si$/HfSiON/p-type Si. This MIS capacitor of the comparative example formed without the deposition of an Al film on $Ni_2Si$ and a heat treatment. In this MIS capacitor, Al is not segregated at the interface between a $Ni_2Si$ film and a HfSiON film.

As can be seen from FIG. 23, the Al thin film deposition and the heat treatment moved the C-V characteristics by approximately 0.5 V in the negative voltage direction. This implies that the effective work function at the interface between the $Ni_2Si$ film and the HfSiON film was reduced. With the work function of $Ni_2Si$ being approximately 4.75 eV, the effective work function of the interface between the $Ni_2Si$ film and the HfSiON film after the Al thin film deposition and the heat treatment should be in the range of 4.2 eV to 4.3 eV.

Figure 24:
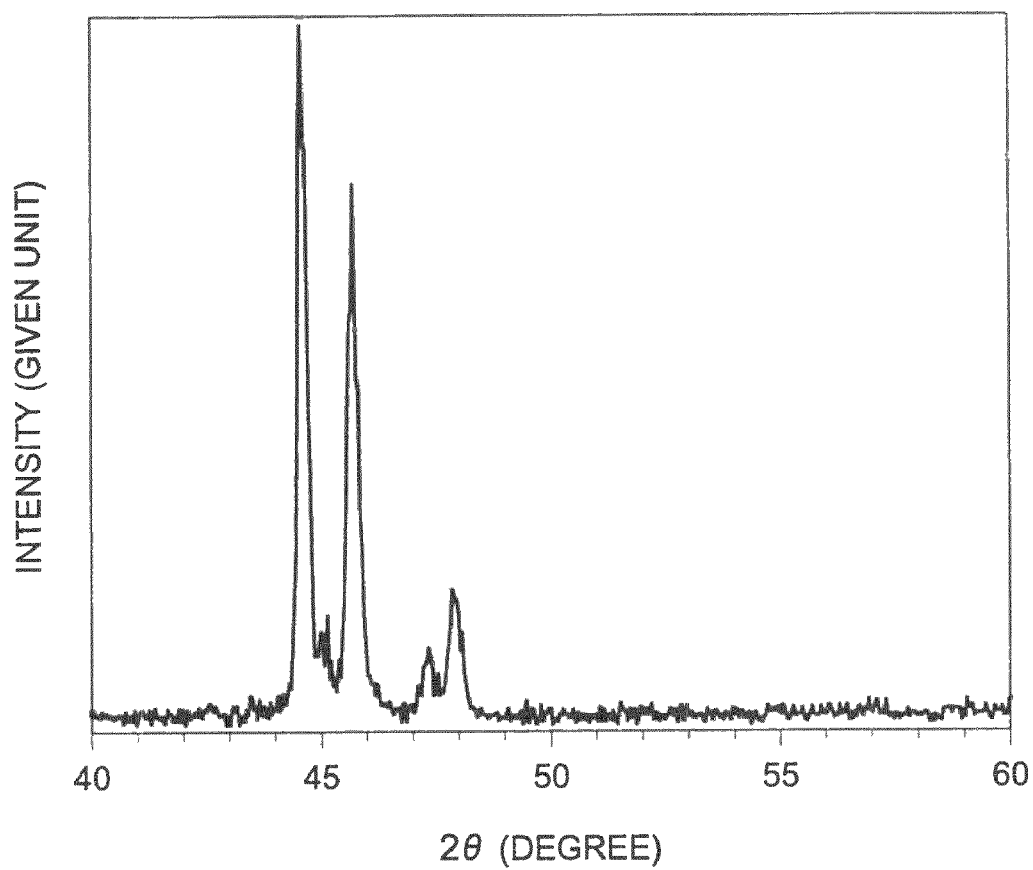
FIG. 24 shows the results of an XRD experiment carried out to observe the composition and the crystalline structure of a Ni silicide electrode manufactured by the fourth embodiment.

FIG. 24 shows the results of an XRD (X-ray diffractometry) experiment that was conducted to check the composition of a Ni silicide produced by the manufacturing method in accordance with this embodiment. In FIG. 24, several peaks can be observed. Those peaks represent crystal diffraction signals all caused by $Ni_2Si$, and a $Ni_2Si$ film was formed with certainty by the manufacturing method in accordance with this embodiment. The locations of the identified $Ni_2Si$ peaks and undetected $Ni_3Si$ and NiSi peaks are as follows:

a) Identified $Ni_2Si$ Peaks
Orthorhombic crystal $Ni_2Si$ (123) $2\theta=44.638°$
Orthorhombic crystal $Ni_2Si$ (203) $2\theta=45.829°$
Orthorhombic crystal $Ni_2Si$ (150) $2\theta=47.347°$
Hexagonal crystal $Ni_2Si$ (110) $2\theta=47.876°$
b) Undetected $Ni_3Si$ and NiSi Peaks
Cubical crystal $Ni_3Si$ (111) $2\theta=44.871°$
Cubical crystal $Ni_3Si$ (200) $2\theta=52.275°$
Cubical crystal $Ni_3Si$ (210) $2\theta=58.817°$
Orthorhombic crystal NiSi (210) $2\theta=44.369°$
Orthorhombic crystal NiSi (202) $2\theta=47.279°$
Orthorhombic crystal NiSi (103) $2\theta=51.438°$
Orthorhombic crystal NiSi (301) $2\theta=55.042°$
Orthorhombic crystal NiSi (212) $2\theta=55.476°$
Orthorhombic crystal NiSi (013) $2\theta=56.326°$
Orthorhombic crystal NiSi (020) $2\theta=56.439°$ Although a Ni silicide film experimentally formed on a flat wafer in a continuous fashion was analyzed in this experiment, the composition of a Ni silicide in an actual MISFET can be checked. For example, a gate stack of a MISFET is taken out by a conventional pick-up method, and cross-section TEM observation is carried out. After the location of a Ni silicide in TEM samples is confirmed through the TEM observation, the composition ratio of Ni to Si in the Ni silicide can be measured by EDX (Energy Dispersive X-ray spectroscopy). To observe the crystal phase of the Ni silicide more closely, the location of the Ni silicide is determined from the cross-section of the TEM samples, and an electron beam converged to a certain extent is emitted onto the location. The diffraction pattern of the electron beam that has passed through the sample is then analyzed.

Figure 25:
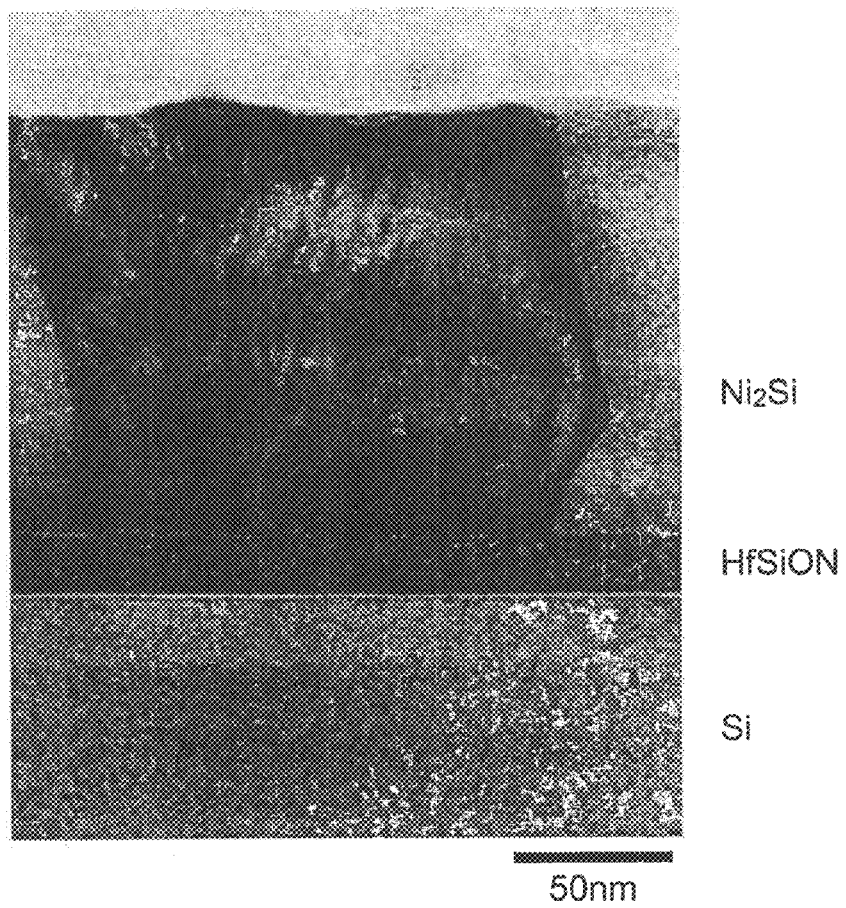
FIG. 25 is a photograph showing the results of a TEM observation of a cross-section of a gate of a CMOS device manufactured by the fourth embodiment.

FIG. 25 shows the results of a cross-section TEM observation of a $Ni_2Si/HfSiON/Si$ structure taken out from the gate stack of an n-channel MIS transistor produced in accordance with this embodiment. Those samples were produced merely for shape observation, and the film thicknesses of the $Ni_2Si$ film and the HfSiON film were not adjusted to obtain optimum device characteristics. Here, it can be seen that the $Ni_2Si$ film has a structure in which only one $Ni_2Si$ grain exists in the film thickness direction. This implies that the Ni silicide of this embodiment does not have a variable composition in the film thickness direction. Without a variation in the composition, the work function at the interface between the Ni silicide and HfSiON is determined by the characteristic value of $Ni_2Si$, and a variation in the threshold voltage of the transistor is restrained.

Figure 26:
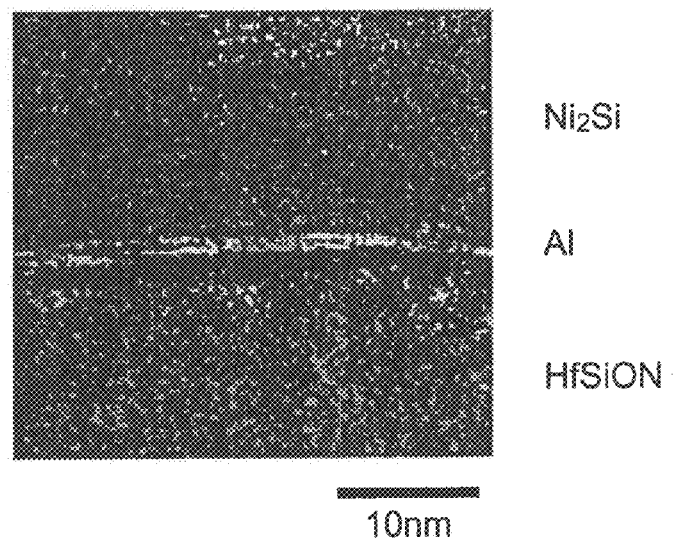
FIG. 26 is a photograph showing the results of a TEM observation of the interface between $Ni_2Si$ and HfSiON in the CMOS device manufactured by the fourth embodiment.

FIG. 26 shows the results of a TEM experiment carried out to observe the interface between the $Ni_2Si$ film and the HfSiON film shown in the TEM photograph in FIG. 25 with high precision. As can be seen from FIG. 26, there is a continuous white contrast layer formed at the interface. The results of a component analysis by EELS show that the white contrast layer mostly contains Al. By EELS, an electron beam is converged to carry out an element analysis with a spatial resolution of nanometer order, and even a very small amount of Al existing at the interface can be detected. Accordingly, it is confirmed that the decrease of the work function at the interface between $Ni_2Si$ and HfSiON detected from the shift in the C-V characteristics shown in FIG. 23 was caused by the work function of the Al segregated at the interface.

Figure 27:
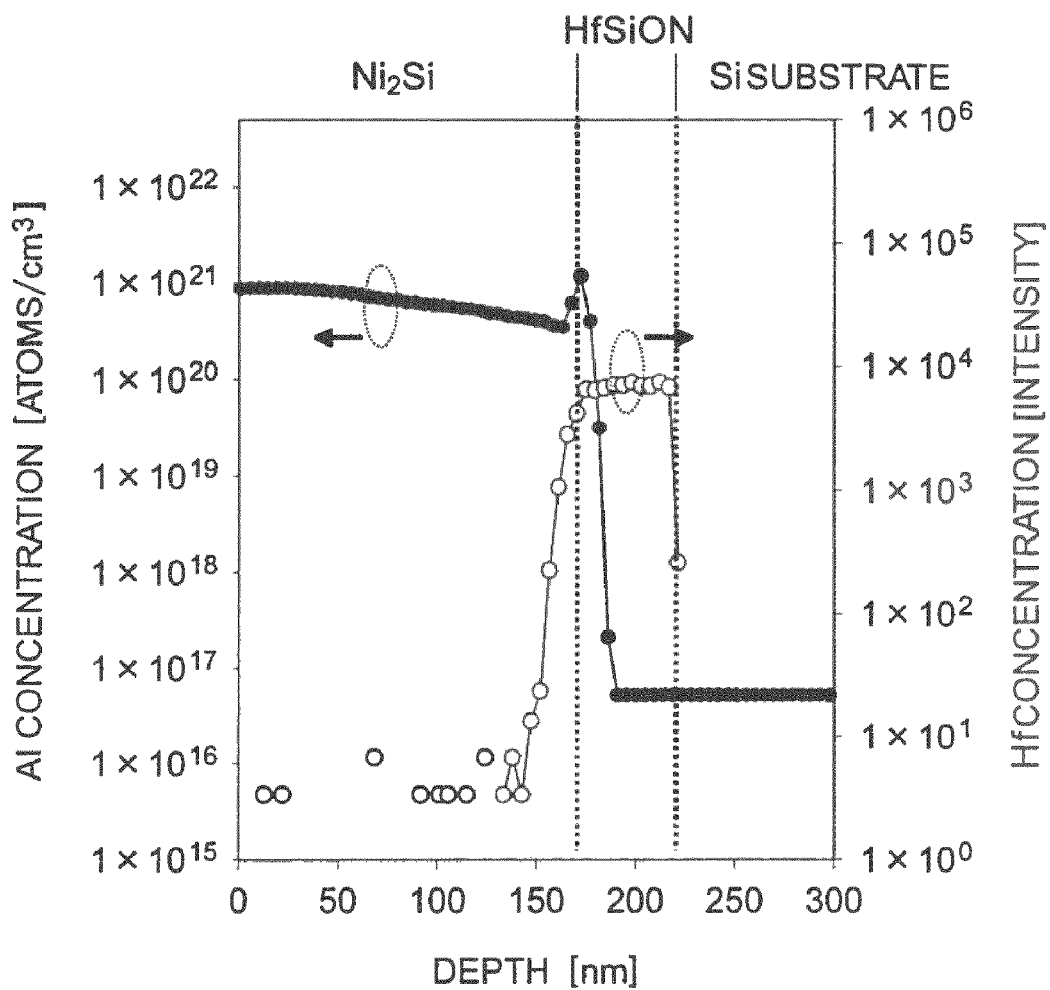
FIG. 27 shows the results of a SIMS analysis carried out to observe the Al element distribution in the $Ni_2Si$/HfSiON stack structure of a gate.

FIG. 27 shows the results of a backside SIMS analysis carried out to observe the Al element distribution (indicated by black dots) in the depth direction inside a stack structure of $Ni_2S/HfSiON$ manufactured by the same method as the manufacturing method in accordance with this embodiment. In this experiment, to accurately measure the Al distribution in the interface between the $Ni_2Si$ film and the HfSiON film and the Al distribution in the $Ni_2Si$ film, the Si substrate was turned into a thin film by physical polishing, and the primary ions, $O_2^+$ ions in this case, were applied onto the substrate. While etching was performed on the samples, evaluations on the element distributions were made. By this analysis method, distribution measurement is carried out, starting from a region with the lowest Al concentration toward a region with higher Al concentration. Accordingly, erroneous measurement of the element distribution due to the element knock-on typically performed by SIMS in the depth direction of the samples is hardly caused, and more accurate Al distribution in the depth direction can be measured. In this experiment, the upper Al layer was removed with a chemical solution or the like before the backside SIMS analysis was carried out. FIG. 27 also shows the Hf concentration distribution (indicated by white dots). Further, the boundaries among the $Ni_2Si$ film, the HfSiON film, and the Si substrate are indicated by dotted lines. As can be seen from FIG. 27, a large amount of Al atoms supplied from the Al thin film deposited on the $Ni_2Si$ film are diffused and distributed in the $Ni_2Si$ film. Particularly, Al pileup is observed at the interface with the HfSiON film. The amount of the Al pileup is sufficient to form an Al continuous layer in the order of approximately $10^{21}$ $cm^{-3}$. Accordingly, the Al existing at the interface between the $Ni_2Si$ film and the HfSiON film confirmed in the cross-section observation shown in FIG. 26 can be determined to have been caused by the Al heat diffusion from the Al thin film above the $Ni_2Si$ film and the segregation effect at the interface. Also, as can be seen from FIG. 27, Al is hardly diffused in the HfSiON film. This implies that the HfSiON film blocks Al diffusion. Al diffusion in the HfSiON film causes poorer insulating film reliability and lower transistor mobility. However, there are no such concerns in this structure.

Figure 28:
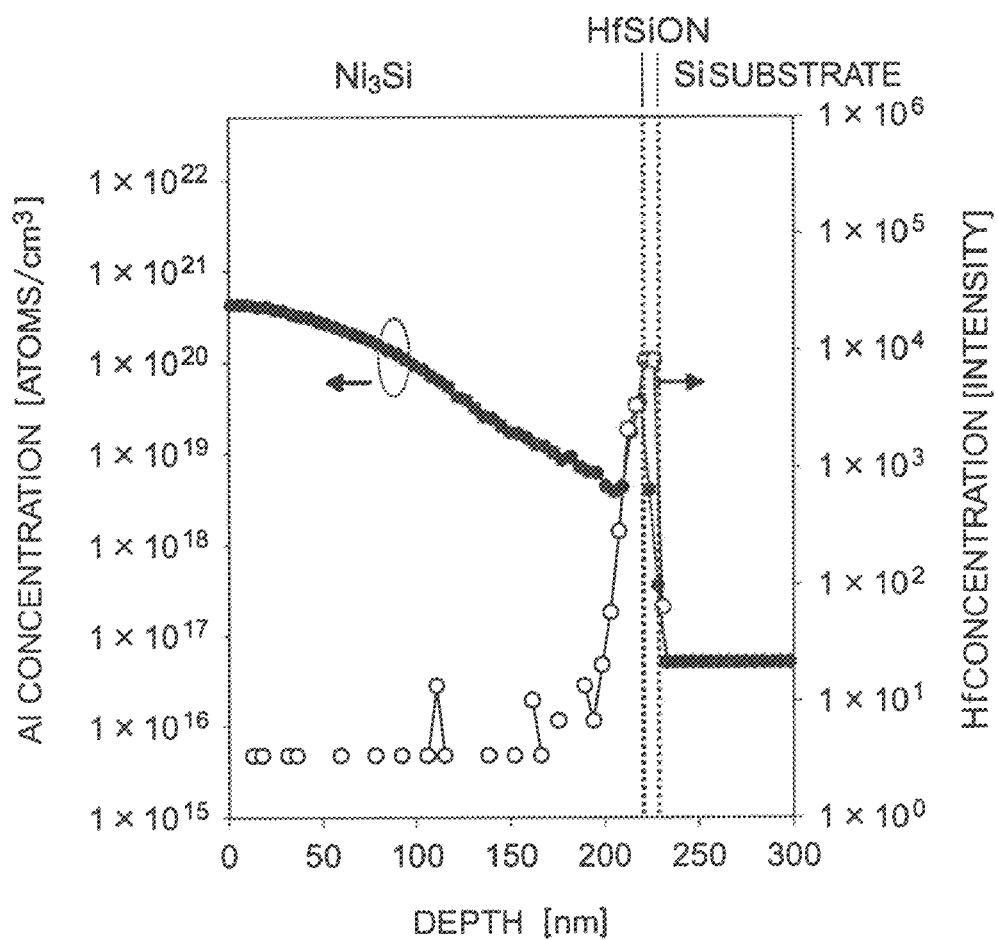
FIG. 28 shows the results of a SIMS analysis carried out to observe the Al element distribution in the $Ni_3Si$/HfSiON stack structure in a case where the silicide of the gate electrode is $Ni_3Si$.

FIG. 28 shows the Al element distribution in the depth direction in a $Ni_3Si/HfSiON$ structure that has a $Ni_3Si$ film, instead of a $Ni_2Si$ film, in a gate electrode of this embodiment. As in the experiment shown in FIG. 27, a backside SIMS analysis was carried out. The conditions for the experiment, such as the conditions for Al thin film deposition and a heat treatment, are the same as the above described conditions for the case with a $Ni_2Si$ film. The film thickness of the HfSiON film is smaller in the experiment using a $Ni_3Si$ film, but the thinner HfSiON film does not affect the Al distribution in the $Ni_3Si$ film and the Al distribution at the interface between the $Ni_3Si$ film and the HfSiON film. As in the case with a $Ni_2Si$ film, Al heat diffusion in the $Ni_3Si$ film was observed. However, the Al distribution in the silicide in the case with a $Ni_3Si$ film greatly differs from the Al distribution in the silicide in the case with a $Ni_2Si$ film. Since the Al distribution in the $Ni_2Si$ film shown in FIG. 27 is substantially flat, the diffusion was supposedly caused at a very high speed. On the other hand, in the case with a $Ni_3Si$ film shown in FIG. 28, the Al amount becomes smaller in the depth direction from the surface. This implies that Al diffusion in a $Ni_3Si$ film is not caused as readily as in a $Ni_2Si$ film. Because of the difference in characteristics, the amount of Al element that has reached the interface with the HfSiON film and piled up at the interface is smaller in the case with a $Ni_3Si$ film. More specifically, the amount of piled-up Al in the case with a $Ni_3Si$ film is almost a hundredth of the amount of piled-up Al in the case with a $Ni_2Si$ film, and an Al continuous layer is hardly formed in the order of approximately $10^{19}$ $cm^{-3}$. Such an Al amount is not sufficient to reduce the effective work function at the interface. Therefore, $Ni_2Si$, rather than $Ni_3Si$, is used for the gate electrodes in this embodiment, so that Al can efficiently reach the interface and reduce the work function.

In this embodiment, the formation of an Al layer at the interface between an electrode made of $Ni_2Si$ and an insulating film made of HfSiON may be carried out through Al ion implantation into the gate electrode of the n-channel MIS transistor, instead of the heat diffusion from an Al thin film. In such a case, however, it is necessary to take measures against Al implantation into the gate insulating film due to the energy struggling that is characteristic of ion implantation. This is because, when the gate insulating is damaged, the leakage current increases, and the transistor performance rapidly deteriorates. To avoid such a situation, it is necessary to set the acceleration energy of the implantation ions at a low value. By doing so, however, the current at the time of ion implantation is lowered, resulting in the problem of an increase in process time. On the other hand, an Al thin film used in this embodiment does not cause Al implantation into the gate insulating film, and the process time can be shorted as only a simple Al film is formed.

As described above, in accordance with this embodiment, the effective work function of the gate electrode of the n-channel MIS transistor can be reduced, and higher CMOS performances can be expected. Also, Ni silicides are produced simultaneously for the n-channel MIS transistor and the p-channel MIS transistor. Thus, higher performances can be achieved with a smaller number of manufacturing procedures.

Modification

Figure 29:
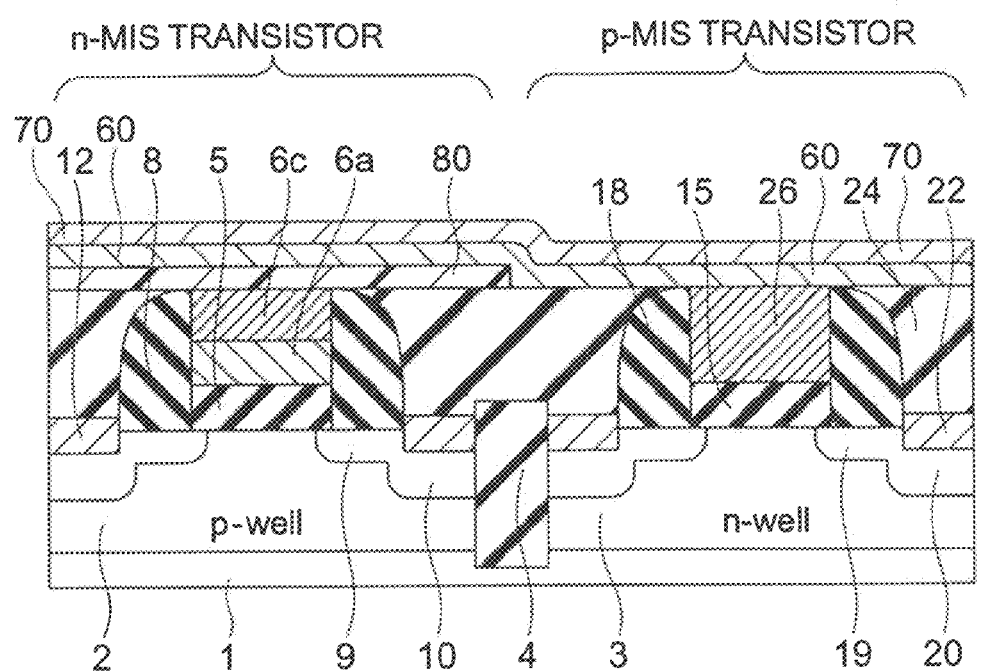
FIG. 29 is a cross-sectional view showing a procedure in a manufacturing method in accordance with a modification of the fourth embodiment.

In the fourth embodiment, the gate electrode of the p-channel MIS transistor is made of $Ni_2Si$, which has the advantage of lower resistance. However, the work function of Ni$_2$Si is approximately 4.75 eV, and a slightly larger work function than that is preferred so as to obtain a sufficiently low threshold voltage for the p-channel MIS transistor. In this modification, a Ti layer 60 and a Ni layer 70 are stacked only on the gate electrode of the p-channel MIS transistor in the structure shown in FIG. 22. For example, a 5-nm thick Ti layer and a 100-nm thick Ni layer are formed in this order by sputtering in a vacuum. Meanwhile, the upper surface of the n-channel MIS transistor is covered with a hard mask 80 made of SiN or the like formed by a known technique (see FIG. 29).

Figure 30:
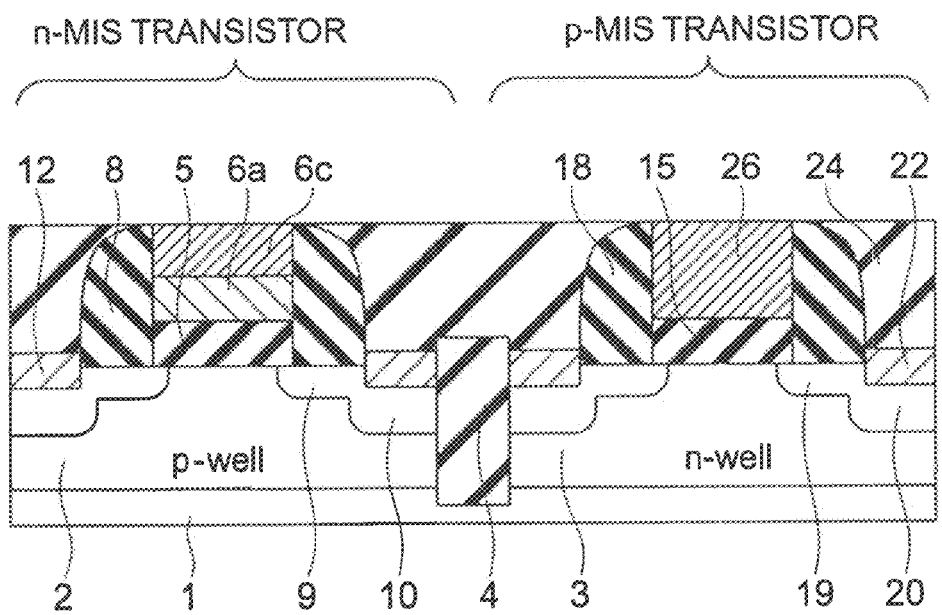
FIG. 30 is a cross-sectional view of a CMISFET manufactured in accordance with the modification of the fourth embodiment.

A heat treatment is then carried out at 500° C. for one minute, so that the Ni of the Ni layer 70 passes through the Ti layer 60 and diffuses in the Ni$_2$Si layer 26. As a result, phase transition is caused, and a stable Ni$_3$Si layer 16 is formed. Here, the Ti reduces the natural oxide film formed on the Ni$_2$Si surface, and facilitates the Ni diffusion. The hard mask 80 and the remaining portions of the Ti layer 60 and the Ni layer 70 are removed by a conventional wet etching technique or the like, so as to obtain the structure shown in FIG. 30.

In this modification, the number of manufacturing procedures becomes slightly larger, but a lower threshold voltage can be achieved for both the n-channel MIS transistor and the p-channel MIS transistor. Accordingly, a CMOS can be designed easily.

Although the embodiments of the present invention have been described so far, the present invention is not limited to those embodiments, and various changes and modifications may be made to them without departing from the scope of the claimed invention. Further, various other inventions may be made by combining the components disclosed in the above described embodiments.

What is claimed is:

1. A semiconductor device comprising:
   a substrate;
   an n-channel MIS transistor including: a p-type semiconductor region formed on the substrate; first source and drain regions being formed in the p-type semiconductor region and being separated from each other; a first gate insulating film formed on the p-type semiconductor region between the first source and drain regions; and a first gate electrode formed on the first gate insulating film and containing Al and a first metal other than Al, the Al being distributed in the direction of the film thickness in the first gate electrode and a distribution of Al concentration having a peak in the vicinity of an interface between the first gate electrode and the first gate insulating film, the peak being lower than a maximum concentration of Al in the first gate electrode; and
   a p-channel MIS transistor including: an n-type semiconductor region formed on the substrate and isolated from the p-type semiconductor region; second source and drain regions being formed in the n-type semiconductor region and being separated from each other; a second gate insulating film formed on the n-type semiconductor region between the second source and drain regions; and a second gate electrode formed on the second gate insulating film and containing the first metal.

2. The device according to claim 1, wherein:
   Al atoms at the peak are in the metallic state or in the sub-oxidized state.

3. The device according to claim 1, wherein:
   at least 30% or more of Al atoms existing at the peak are in a metallic state or a sub-oxidized state.

4. The device according to claim 1, wherein:
   the first gate electrode has a crystalline phase.

5. The device according to claim 1, wherein:
   a grain size in the each of first and second gate electrodes is ½ of a gate length of each of the n-channel and p-channel MIS transistors or smaller.

6. The device according to claim 1, wherein:
   a height of the first gate electrode is two or three times greater than a gate length of the first gate electrode, and a height of the second gate electrode is two or three times greater than a gate length of the second gate electrode.

7. The device according to claim 1, wherein:
   heights of the first gate electrode and the second electrode are 100 nm or less and 20 nm or more.

8. The device according to claim 1, wherein the first and second gate insulating films contain at least one metal selected from the group consisting of Hf, Zr, and La.

9. The device according to claim 1, wherein:
   the first and second gate insulating films are made of a material that has a larger Gibbs free energy than Al$_2$O$_3$.

10. The device according to claim 1, wherein:
    the first gate insulating film contains Hf and La.

11. The device according to claim 10, wherein:
    the composition ratio of Hf and La is made higher in the vicinity of the interface between the first gate insulating film and the first gate electrode.

12. The device according to claim 1, wherein:
    the first gate insulating film has an SiO$_2$ layer.

13. The device according to claim 1, wherein:
    the first and the second gate insulating films contain Si or N.

14. The device according to claim 1, wherein:
    the first and the second gate insulating films are HfSiON films.

15. The device according to claim 1, wherein:
    the first source and drain regions contain n-type diffusion layers and Ni silicide layers formed on the n-type diffusion layers.

16. The device according to claim 1, wherein:
    the first source and drain regions contain n-type diffusion layers, and Ni silicide layers made of NiSi formed on the n-type diffusion layers.

17. The device according to claim 1, wherein:
    the substrate is a bulk substrate.

18. The device according to claim 1, wherein:
    the p-type semiconductor region between the first source and drain regions is made of SiGe, Ge, or biased Si.

19. The device according to claim 1, wherein:
    at least one nonmetallic material of phosphorus, arsenic, and antimony is contained in an interface between the first gate insulating film and the first gate electrode at least on the side of the first gate electrode; and
    boron is contained in an interface between the second gate insulating film and the second gate electrode at least on the side of the second gate insulating film.

20. The device according to claim 1, wherein:
    the first gate electrode further contains a nonmetal element.

21. The device according to claim 20, wherein:
    the first metal is Ni; and
    the nonmetal element is Si.

22. The device according to claim 1, wherein:
    the first gate insulating film is an amorphous layer.

23. The device according to claim 1, wherein:
    the first gate insulating film is an epitaxial layer.

24. The device according to claim 1, wherein:
    the peak is formed by Al diffusion in the first gate electrode.

25. The device according to claim 1, wherein:

the first gate electrode has a work function of 4.4 eV or smaller.

26. The device according to claim 1, wherein:

the second gate electrode has a work function of 4.8 eV or larger.

27. The device according to claim 1, wherein:

the gate length of the n-channel MIS transistor is 30 nm or less.

28. The device according to claim 1, wherein:

the gate length of the p-channel MIS transistor is 30 nm or less.

* * * * *